United States Patent
Kaneko et al.

(10) Patent No.: US 11,569,068 B2
(45) Date of Patent: Jan. 31, 2023

(54) PLASMA PROCESSING APPARATUS

(71) Applicant: TOKYO ELECTRON LIMITED, Tokyo (JP)

(72) Inventors: Kazushi Kaneko, Miyagi (JP); Takashi Hasegawa, Miyagi (JP); Koji Koyama, Miyagi (JP); Naoki Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 217 days.

(21) Appl. No.: 15/821,588

(22) Filed: Nov. 22, 2017

(65) Prior Publication Data

US 2018/0151332 A1     May 31, 2018

(30) Foreign Application Priority Data

Nov. 28, 2016   (JP) .............................. JP2016-230186

(51) Int. Cl.
   *H01J 37/32* (2006.01)

(52) U.S. Cl.
   CPC ........ *H01J 37/32229* (2013.01); *H01J 37/32* (2013.01); *H01J 37/3222* (2013.01); *H01J 37/32275* (2013.01); *H01J 37/32311* (2013.01); *H01J 37/32449* (2013.01); *H01J 37/32715* (2013.01); *H01J 37/32834* (2013.01); *H01J 2237/006* (2013.01); *H01J 2237/186* (2013.01); *H01J 2237/1825* (2013.01)

(58) Field of Classification Search
   USPC ............................... 156/345.41; 118/723 AN
   See application file for complete search history.

(56) References Cited

U.S. PATENT DOCUMENTS

| | | | |
|---|---|---|---|
| 5,942,672 A * | 8/1999 | Harwell ............. | G01N 15/0205 73/1.07 |
| 7,902,991 B2 * | 3/2011 | Park ................... | H01J 37/32174 340/658 |
| 2014/0197761 A1 * | 7/2014 | Grandemenge ... | H01J 37/32009 315/502 |

(Continued)

FOREIGN PATENT DOCUMENTS

| | | | |
|---|---|---|---|
| JP | 2009-099496 A | 5/2009 | |
| JP | 4299282 B2 * | 7/2009 | ............... G21B 1/00 |

(Continued)

*Primary Examiner* — Ram N Kackar

(74) *Attorney, Agent, or Firm* — Studebaker & Brackett PC

(57) ABSTRACT

A plasma processing apparatus includes a microwave output unit, a wave guide tube, a tuner, a demodulation unit, and a calculation unit. The microwave output unit outputs a microwave having power corresponding to setting power while frequency-modulating the microwave in a setting frequency range. The wave guide tube guides the microwave to an antenna of a chamber main body. The tuner is provided in the wave guide tube and adjusts a position of a movable plate. The demodulation unit is provided in the wave guide tube, and acquires travelling wave power and reflected wave power for each frequency. The calculation unit calculates a frequency at which a reflection coefficient, which is calculated on the basis of the travelling wave power and the reflected wave power, for each frequency becomes a minimum point as an absorption frequency.

2 Claims, 28 Drawing Sheets

(56) References Cited

U.S. PATENT DOCUMENTS

2014/0225504 A1\* 8/2014 Kaneko ............ H01J 37/32192
　　　　　　　　　　　　　　　　　315/111.21
2017/0345664 A1　11/2017 Kubota

FOREIGN PATENT DOCUMENTS

| JP | 4619468 B2 | 1/2011 |
| TW | 201626429 A | 7/2016 |
| WO | 2016/002590 A1 | 1/2016 |
| WO | 2016/104098 A1 | 6/2016 |

\* cited by examiner

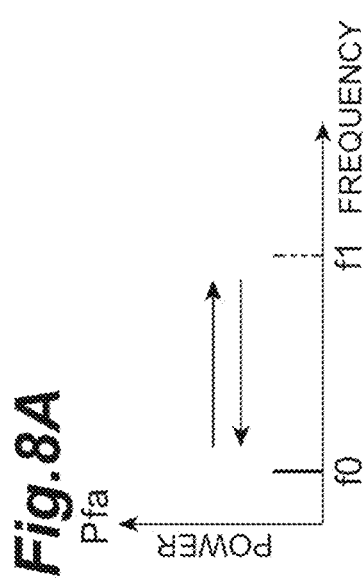
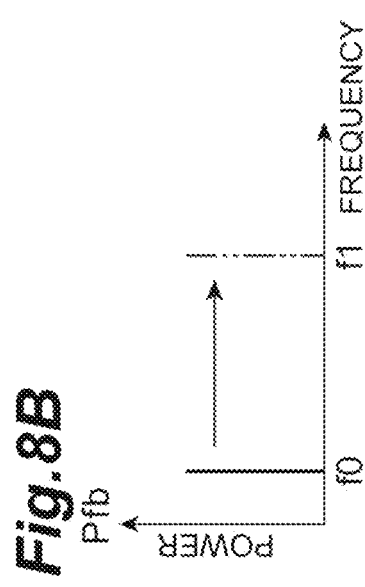
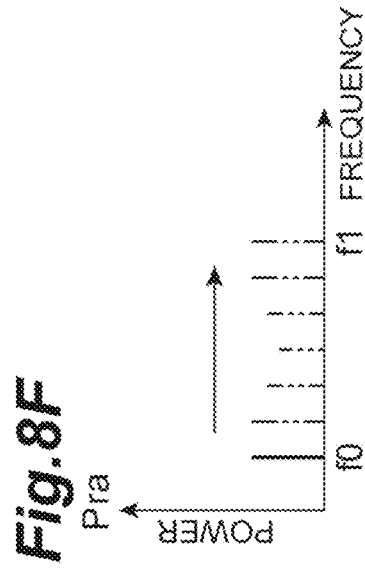
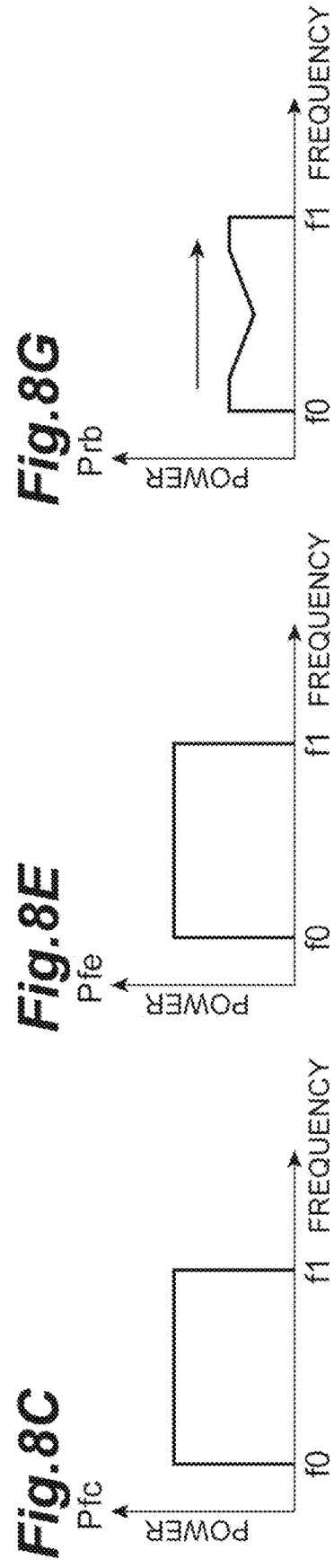

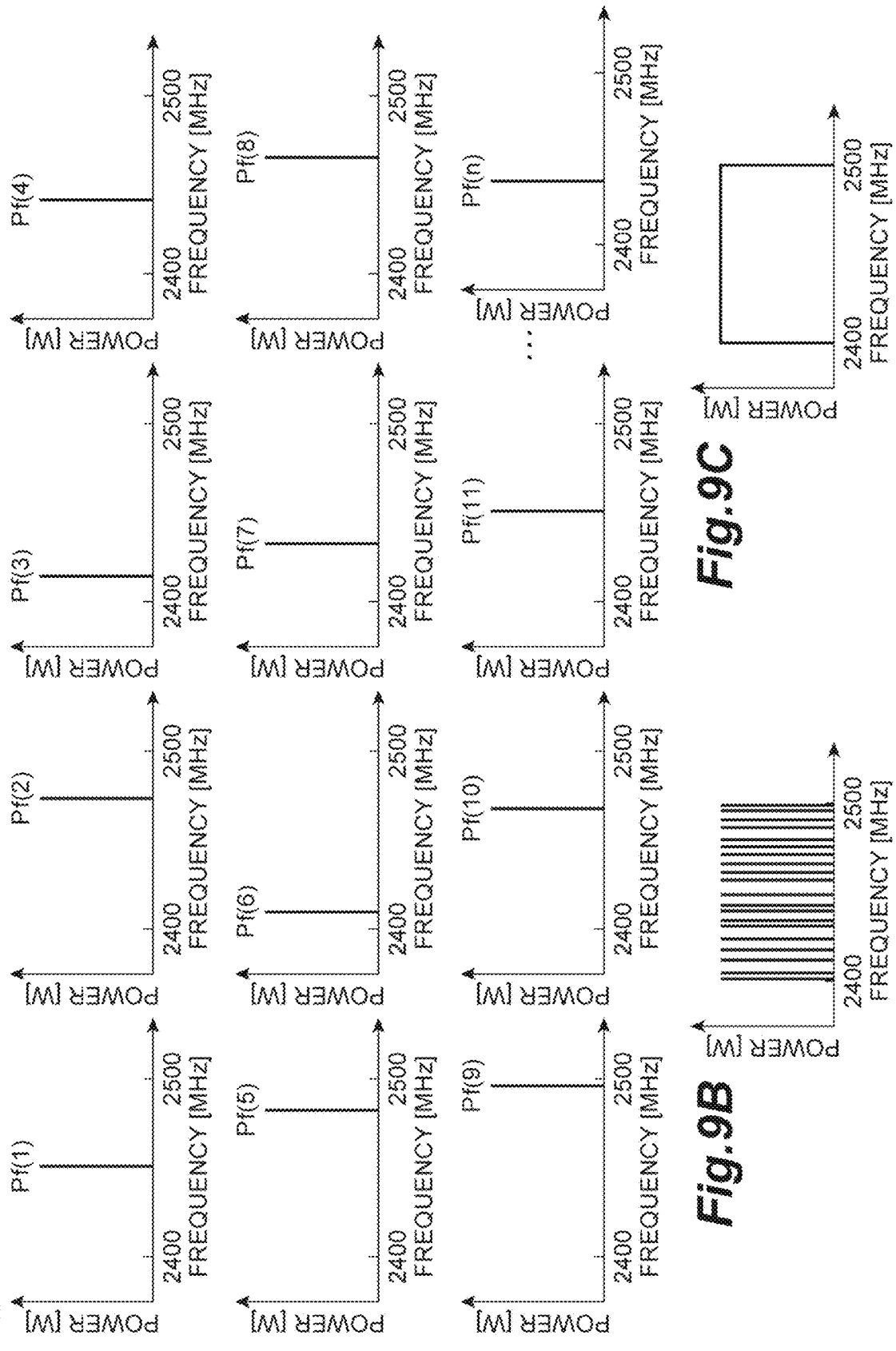

PLASMA PROCESSING APPARATUS

CROSS-REFERENCE TO RELATED APPLICATIONS

This application is based on and claims the benefit of priority from Japanese Patent Application No. 2016-230186 filed on Nov. 28, 2016, and the entire contents of which are incorporated herein by reference.

BACKGROUND

Field

Exemplary embodiments of the present disclosure relates to a plasma processing apparatus.

Related Background Art

A plasma processing apparatus is used to manufacture an electronic device such as a semiconductor device. In a plasma processing apparatus disclosed in Japanese Patent No. 4619468, a gas is excited by using microwaves. The apparatus includes a microwave output unit, a tuner, and a first antenna that emits radio frequency power to plasma to excite a gas. In addition, in the apparatus, a second antenna is disposed in a plasma space to monitor a plasma state. The second antenna operates as a resonant antenna, and is used as a probe that detects reflected wave power from the plasma. The apparatus calculates a frequency at which the reflected wave power becomes the minimum value as an absorption frequency.

SUMMARY

In first aspect, there is provided a plasma processing apparatus including a microwave output unit, a wave guide tube, a tuner, a demodulation unit, and a calculation unit. The microwave output unit outputs a microwave having power corresponding to setting power while frequency-modulating the microwave in a setting frequency range. The wave guide tube guides the microwave, which is output by the microwave output unit, to an antenna of a chamber main body. The tuner is provided in the wave guide tube and adjusts a position of a movable plate so that impedance on the microwave output unit side and impedance on the antenna side match each other. The demodulation unit is provided in the wave guide tube, and acquires travelling wave power that is power of a travelling wave that travels on an inner side of the wave guide tube, and reflected wave power that is power of a reflected wave from the antenna side for each frequency. The calculation unit calculates a frequency at which a reflection coefficient, which is calculated on the basis of the travelling wave power and the reflected wave power, for each frequency becomes a minimum point as an absorption frequency.

In second aspect, there is provided a plasma processing apparatus including a microwave output unit, a wave guide tube, a tuner, a demodulation unit, and a calculation unit. The microwave output unit outputs a microwave having power corresponding to setting power while frequency-modulating the microwave in a setting frequency range. The wave guide tube guides the microwave, which is output by the microwave output unit, to an antenna of a chamber main body. The tuner is provided in the wave guide tube and adjusts a position of a movable plate so that impedance on the microwave output unit side and impedance on the antenna side match each other. The demodulation unit is provided in the wave guide tube, and acquires reflected wave power that is power of a reflected wave from the antenna side for each frequency. The calculation unit calculates a frequency, at which the reflected wave power becomes a minimum point, as an absorption frequency.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIGS. 8A to 8G are views illustrating an example of travelling wave power and reflected wave power in each constituent element.

FIGS. 9A to 9C are views illustrating an example of the travelling wave power that is acquired in the demodulation unit.

DETAILED DESCRIPTION

Figure 1:
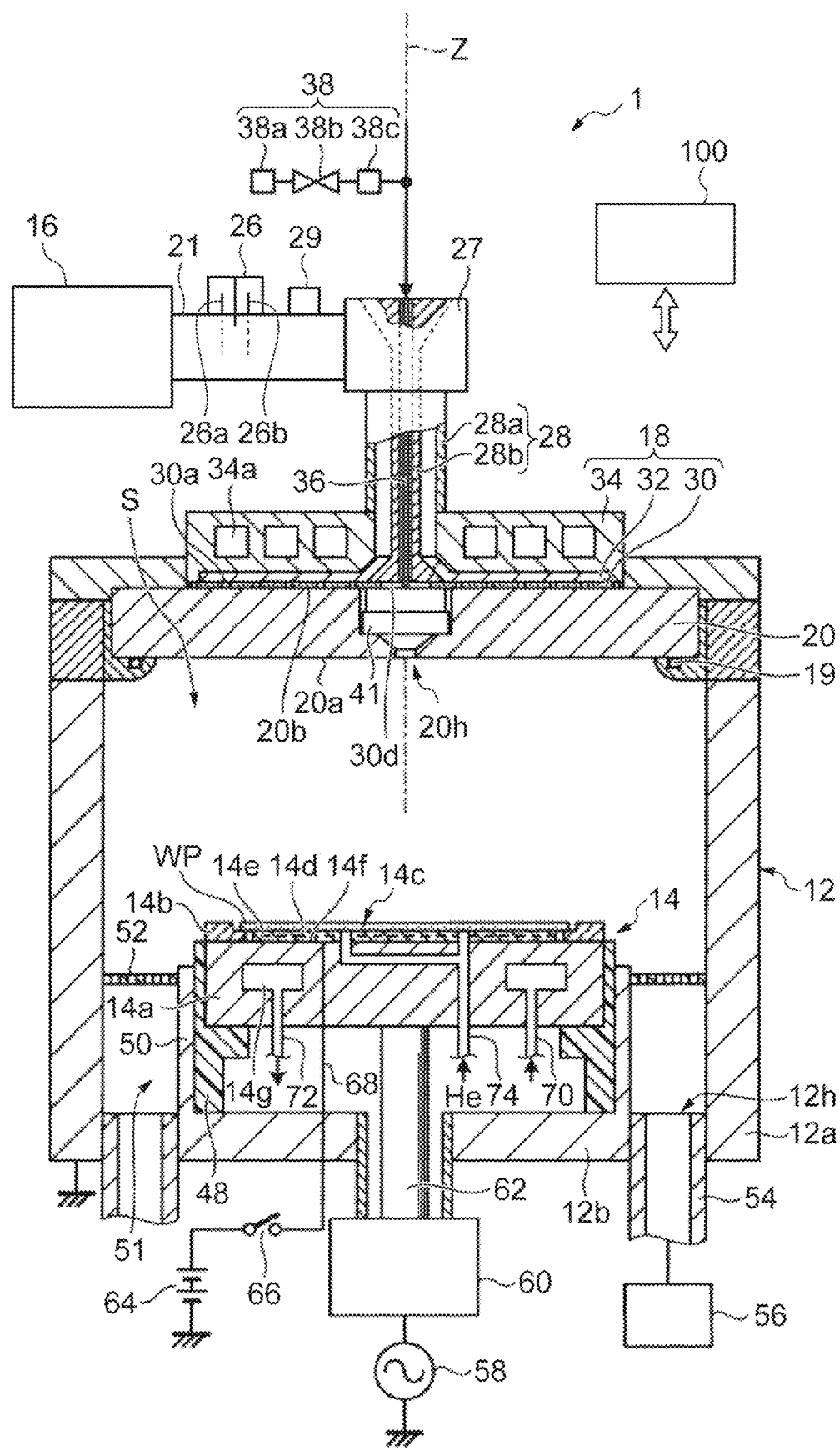
FIG. 1 is a view illustrating a plasma processing apparatus according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In a case where the probe is disposed in the plasma space similar to the plasma processing apparatus described in Japanese Patent No. 4619468, there is a concern that the probe may apply disturbance to the plasma. According to this, in the plasma processing apparatus described in Japanese Patent No. 4619468, plasma may be unstable in some cases.

In this technical field, there is a demand for a plasma processing apparatus capable of calculating an absorption frequency without applying disturbance to plasma.

In first aspect, there is provided a plasma processing apparatus including a microwave output unit, a wave guide tube, a tuner, a demodulation unit, and a calculation unit. The microwave output unit outputs a microwave having power corresponding to setting power while frequency-modulating the microwave in a setting frequency range. The wave guide tube guides the microwave, which is output by the microwave output unit, to an antenna of a chamber main body. The tuner is provided in the wave guide tube and adjusts a position of a movable plate so that impedance on the microwave output unit side and impedance on the antenna side match each other. The demodulation unit is provided in the wave guide tube, and acquires travelling wave power that is power of a travelling wave that travels on an inner side of the wave guide tube, and reflected wave power that is power of a reflected wave from the antenna side for each frequency. The calculation unit calculates a frequency at which a reflection coefficient, which is calculated on the basis of the travelling wave power and the reflected wave power, for each frequency becomes a minimum point as an absorption frequency.

In the plasma processing apparatus according to the first aspect, the demodulation unit, which acquires the travelling wave power and the reflected wave power for each frequency, is provided in the wave guide tube. In addition, a frequency, at which a reflection coefficient for each frequency becomes a minimum point, is calculated as an absorption frequency by the calculation unit. As described above, in this apparatus, it is not necessary to dispose a probe in a plasma space, and thus it is possible to calculate the absorption frequency without applying disturbance to plasma.

In second aspect, there is provided a plasma processing apparatus including a microwave output unit, a wave guide tube, a tuner, a demodulation unit, and a calculation unit. The microwave output unit outputs a microwave having power corresponding to setting power while frequency-modulating the microwave in a setting frequency range. The wave guide tube guides the microwave, which is output by the microwave output unit, to an antenna of a chamber main body. The tuner is provided in the wave guide tube and adjusts a position of a movable plate so that impedance on the microwave output unit side and impedance on the antenna side match each other. The demodulation unit is provided in the wave guide tube, and acquires reflected wave power that is power of a reflected wave from the antenna side for each frequency. The calculation unit calculates a frequency, at which the reflected wave power becomes a minimum point, as an absorption frequency.

In the plasma processing apparatus according to the second aspect, the demodulation unit, which acquires the reflected wave power for each frequency, is provided in the wave guide tube. In addition, a frequency, at which reflected wave power becomes a minimum point, is calculated as an absorption frequency by the calculation unit. As described above, in this apparatus, it is not necessary to dispose a probe in a plasma space, and thus it is possible to calculate the absorption frequency without applying disturbance to plasma.

In an exemplary embodiment, the plasma processing apparatus may further include a notification unit that outputs maintenance information corresponding to a difference between the absorption frequency and a reference absorption frequency that is acquired in advance. In the plasma processing apparatus that uses a microwave, a ceiling plate and the like are consumed in correspondence with use, and thus the absorption frequency varies. According to this, a magnitude of a difference between a reference absorption frequency that is acquired in advance at reference time such as at the time of shipment, after maintenance, and after cleaning, and an absorption frequency that is calculated by the calculation unit represents the degree of consumption of constituent elements of the plasma processing apparatus from the reference time to the present time. In the plasma processing apparatus, maintenance information, which includes information indicating whether or not the apparatus is consumed from the reference time and the like, is output by the notification unit in correspondence with the difference. Accordingly, the plasma processing apparatus can notify a user and the like of the maintenance information.

In an exemplary embodiment, in a case where the difference between the absorption frequency and the reference absorption frequency is equal to or greater than a first threshold value, the notification unit may output maintenance information indicating that maintenance is necessary. In this case, the plasma processing apparatus can notify the user and the like of necessity of maintenance.

In an exemplary embodiment, the plasma processing apparatus may further include a frequency setting unit that changes a power supply frequency of the microwave output unit in correspondence with a difference between the absorption frequency and the power supply frequency of the microwave output unit. In a case where the absorption frequency of plasma is closer to the power supply frequency of the microwave output unit, there is a concern that plasma may be unstable. The frequency setting unit of the plasma processing apparatus changes the power supply frequency of the microwave output unit in correspondence with the difference, and thus it is possible to prevent plasma from being unstable.

In an exemplary embodiment, in a case where the difference between the absorption frequency and the power supply frequency is equal to or less than a second threshold value, the frequency setting unit may increase or decrease the power supply frequency by a predetermined frequency. In this case, the plasma processing apparatus can prevent the absorption frequency of plasma from being close to the power supply frequency of the microwave output unit. Accordingly, the plasma processing apparatus can prevent the plasma from being unstable.

As described above, it is possible to calculate the absorption frequency without applying disturbance to plasma.

Hereinafter, various exemplary embodiments will be described in detail with reference to accompanying drawings. Meanwhile, like elements in respective drawings will be denoted by like reference numerals.

Overview of Plasma Processing Apparatus

FIG. 1 is a view illustrating a plasma processing apparatus according to an embodiment. A plasma processing apparatus 1 illustrated in FIG. 1 includes a chamber main body 12 and a microwave output device 16 (an example of a microwave output unit). The plasma processing apparatus 1 may further include a stage 14, an antenna 18, and a dielectric window 20.

The chamber main body 12 provides a processing space S at the inside thereof. The chamber main body 12 includes a side wall 12a and a bottom portion 12b. The side wall 12a is formed in an approximately cylindrical shape. A central axial line of the side wall 12a approximately matches an axial line Z that extends in a vertical direction. The bottom portion 12b is provided on a lower end side of the side wall 12a. An exhaust hole 12h is provided in the bottom portion 12b. In addition, an upper end of the side wall 12a is opened.

The dielectric window 20 is provided over the upper end of the side wall 12a. The dielectric window 20 includes a lower surface 20a that faces the processing space S. The dielectric window 20 closes the opening in the upper end of the side wall 12a. An O-ring 19 is interposed between the dielectric window 20 and the upper end of the side wall 12a. Sealing of the chamber main body 12 is more reliably obtained due to the O-ring 19.

The stage 14 is accommodated in the processing space S. The stage 14 is provided to face the dielectric window 20 in the vertical direction. In addition, the stage 14 is provided so that the processing space S is provided between the dielectric window 20 and the stage 14. The stage 14 is configured to support a workpiece WP (for example, a wafer) that is mounted thereon.

In an embodiment, the stage 14 includes a base 14a and an electrostatic chuck 14c. The base 14a has an approximately disc shape, and is formed from a conductive material such as aluminum. A central axial line of the base 14a approximately matches the axial line Z. The base 14a is supported by a cylindrical support 48. The cylindrical support 48 is formed from an insulating material, and extends from the bottom portion 12b in a vertically upward direction. A conductive cylindrical support 50 is provided on an outer periphery of the cylindrical support 48. The cylindrical support 50 extends from the bottom portion 12b of the chamber main body 12 along the outer periphery of the cylindrical support 48 in a vertically upward direction. An annular exhaust path 51 is formed between the cylindrical support 50 and the side wall 12a.

A baffle plate 52 is provided at an upper portion of the exhaust path 51. The baffle plate 52 has an annular shape. A plurality of through-holes, which pass through the baffle plate 52 in a plate thickness direction, are formed in the baffle plate 52. The above-described exhaust hole 12h is provided on a lower side of the baffle plate 52. An exhaust device 56 is connected to the exhaust hole 12h through an exhaust pipe 54. The exhaust device 56 includes an automatic pressure control valve (APC), and a vacuum pump such as a turbo-molecular pump. A pressure inside the processing space S may be reduced to a desired vacuum degree by the exhaust device 56.

The base 14a also functions as a radio frequency electrode. A radio frequency power supply 58 for RF bias is electrically connected to the base 14a through a feeding rod 62 and a matching unit 60. The radio frequency power supply 58 outputs a constant frequency that is suitable to control ion energy that is inducted to the workpiece WP, for example, a radio frequency (hereinafter, appropriately referred to as "radio frequency for bias") of 13.65 MHz with power that is set. The matching unit 60 accommodates a matching device configured to attain matching between impedance on the radio frequency power supply 58 side, and impedance mainly on a load side such as an electrode, plasma, and the chamber main body 12. A blocking capacitor for self-bias generation is included in the matching device.

The electrostatic chuck 14c is provided on an upper surface of the base 14a. The electrostatic chuck 14c holds the workpiece WP with an electrostatic suction force. The electrostatic chuck 14c includes an electrode 14d, an insulating film 14e, and an insulating film 14f, and has an approximately disc shape. A central axial line of the electrostatic chuck 14c approximately matches the axial line Z. The electrode 14d of the electrostatic chuck 14c is constituted by a conductive film, and is provided between the insulating film 14e and the insulating film 14f. A DC power supply 64 is electrically connected to the electrode 14d through a switch 66 and a covered wire 68. The electrostatic chuck 14c can suction and hold the workpiece WP by a coulomb's force that is generated by a DC voltage applied from the DC power supply 64. In addition, a focus ring 14b is provided on the base 14a. The focus ring 14b is disposed to surround the workpiece WP and the electrostatic chuck 14c.

A coolant chamber 14g is provided at the inside of the base 14a. For example, the coolant chamber 14g is formed to extend around the axial line Z. A coolant is supplied into the coolant chamber 14g from a chiller unit through a pipe 70. The coolant, which is supplied into the coolant chamber 14g, returns to the chiller unit through a pipe 72. A temperature of the coolant is controlled by the chiller unit, and thus a temperature of the electrostatic chuck 14c and a temperature of the workpiece WP are controlled.

In addition, a gas supply line 74 is formed in the stage 14. The gas supply line 74 is provided to supply a heat transfer gas, for example, a He gas to a space between an upper surface of the electrostatic chuck 14c and a rear surface of the workpiece WP.

The microwave output device 16 outputs a microwave that excites a process gas that is supplied into the chamber main body 12. The microwave output device 16 is configured to variably adjust a frequency, power, and a bandwidth of the microwave. The microwave output device 16 can generate a microwave having power corresponding to setting power while performing frequency modulation in a setting frequency range. The frequency modulation represents changing of a frequency in correspondence with time. The frequency-modulated microwave will be described later. In an example, the microwave output device 16 can adjust the power of the microwave in a range of 0 W to 5000 W, can adjust the frequency of the microwave in a range of 2400 MHz to 2500 MHz, and can adjust the bandwidth of the microwave in a range of 0 MHz to 100 MHz.

The plasma processing apparatus 1 further includes a wave guide tube 21, a tuner 26, a mode converter 27, and a coaxial wave guide tube 28. An output unit of the microwave output device 16 is connected to one end of the wave guide tube 21. The other end of the wave guide tube 21 is connected to the mode converter 27. That is, the wave guide tube 21 is configured as a tube path that guides a microwave, which is output by the microwave output device 16, to the antenna 18 of the chamber main body 12. For example, the wave guide tube 21 is a rectangular wave guide tube. The tuner 26 is provided in the wave guide tube 21. As an example, the tuner 26 includes a movable plate 26a and a movable plate 26b. The movable plate 26a and the movable plate 26b are configured to adjust a protrusion amount thereof with respect to an inner space of the wave guide tube 21. The tuner 26 adjusts a protrusion position of each of the movable plate 26a and the movable plate 26b with respect to a reference position to match impedance (impedance on a microwave output unit side) of the microwave output device 16 and a load. For example, the tuner 26 adjusts a position of the movable plates to match the impedance of the microwave output device 16 and impedance (impedance on an antenna side) of the chamber main body 12.

The mode converter 27 converts a mode of the microwave transmitted from the wave guide tube 21, and supplies the microwave after mode conversion to the coaxial wave guide tube 28. The coaxial wave guide tube 28 includes an outer conductor 28a and an inner conductor 28b. The outer conductor 28a has an approximately cylindrical shape, and a central axial line thereof approximately matches the axial line Z. The inner conductor 28b has an approximately cylindrical shape, and extends on an inner side of the outer conductor 28a. A central axial line of the inner conductor 28b approximately matches the axial line Z. The coaxial wave guide tube 28 transmits the microwave from the mode converter 27 to the antenna 18.

The antenna 18 is provided on a surface 20b opposite to the lower surface 20a of the dielectric window 20. The antenna 18 includes a slot plate 30, a dielectric plate 32, and a cooling jacket 34.

The slot plate 30 is provided on a surface 20b of the dielectric window 20. The slot plate 30 is formed from a conductive metal, and has an approximately disc shape. A central axial line of the slot plate 30 approximately matches the axial line Z. A plurality of slot holes 30a are formed in the slot plate 30. In an example, the plurality of slot holes 30a constitute a plurality of slot pairs. Each of the plurality of slot pairs includes two slot holes 30a which extend in directions interesting each other and have an approximately elongated hole shape. The plurality of slot pairs are arranged along one or more concentric circles centering around the axial line Z. In addition, a through-hole 30d, through which a conduit 36 to be described later can pass, is formed in the central portion of the slot plate 30.

The dielectric plate 32 is formed on the slot plate 30. The dielectric plate 32 is formed from a dielectric material such as quartz, and has an approximately disc shape. A central axial line of the dielectric plate 32 approximately matches the axial line Z. The cooling jacket 34 is provided on the dielectric plate 32. The dielectric plate 32 is provided between the cooling jacket 34 and the slot plate 30.

A surface of the cooling jacket 34 has conductivity. A flow passage 34a is formed at the inside of the cooling jacket 34. A coolant is supplied to the flow passage 34a. A lower end of the outer conductor 28a is electrically connected to an upper surface of the cooling jacket 34. In addition, a lower end of the inner conductor 28b passes through a hole formed in a central portion of the cooling jacket 34 and the dielectric plate 32 and is electrically connected to the slot plate 30.

A microwave from the coaxial wave guide tube 28 propagates through the inside of the dielectric plate 32 and is supplied to the dielectric window 20 from the plurality of slot holes 30a of the slot plate 30. The microwave, which is supplied to the dielectric window 20, is introduced into the processing space S.

The conduit 36 passes through an inner hole of the inner conductor 28b of the coaxial wave guide tube 28. In addition, as described above, the through-hole 30d, through which the conduit 36 can pass, is formed at the central portion of the slot plate 30. The conduit 36 extends to pass through the inner hole of the inner conductor 28b, and is connected to a gas supply system 38.

The gas supply system 38 supplies a process gas for processing the workpiece WP to the conduit 36. The gas supply system 38 may include a gas source 38a, a valve 38b, and a flow rate controller 38c. The gas source 38a is a gas source of the process gas. The valve 38b switches supply and supply stoppage of the process gas from the gas source 38a. For example, the flow rate controller 38c is a mass flow controller, and adjusts a flow rate of the process gas from the gas source 38a.

The plasma processing apparatus 1 may further include an injector 41. The injector 41 supplies a gas from the conduit 36 to a through-hole 20h that is formed in the dielectric window 20. The gas, which is supplied to the through-hole 20h of the dielectric window 20, is supplied to the processing space S. In addition, the process gas is excited by a microwave that is introduced into the processing space S from the dielectric window 20. According to this, plasma is generated in the processing space S, and the workpiece WP is processed by active species such as ions and/or radicals from the plasma.

The plasma processing apparatus 1 further includes a controller 100. The controller 100 collectively controls respective units of the plasma processing apparatus 1. The controller 100 may include a processor such as a CPU, a user interface, and a storage unit.

The processor executes a program and a process recipe which are stored in the storage unit to collectively control respective units such as the microwave output device 16, the stage 14, the gas supply system 38, and the exhaust device 56.

The user interface includes a keyboard or a touch panel with which a process manager performs an command input operation and the like so as to manage the plasma processing apparatus 1, a display that visually displays an operation situation of the plasma processing apparatus 1 and the like, and the like.

The storage unit stores control programs (software) for realizing various kinds of processing executed by the plasma processing apparatus 1 by a control of the processor, a process recipe including process condition data and the like, and the like. The processor calls various kinds of control programs from the storage unit and executes the control programs in correspondence with necessity including an instruction from the user interface. Desired processing is executed in the plasma processing apparatus 1 under a control of the processor as described above.

Configuration Example of Microwave Output Device 16, Tuner 26, and Demodulation Unit 29

Figure 2:
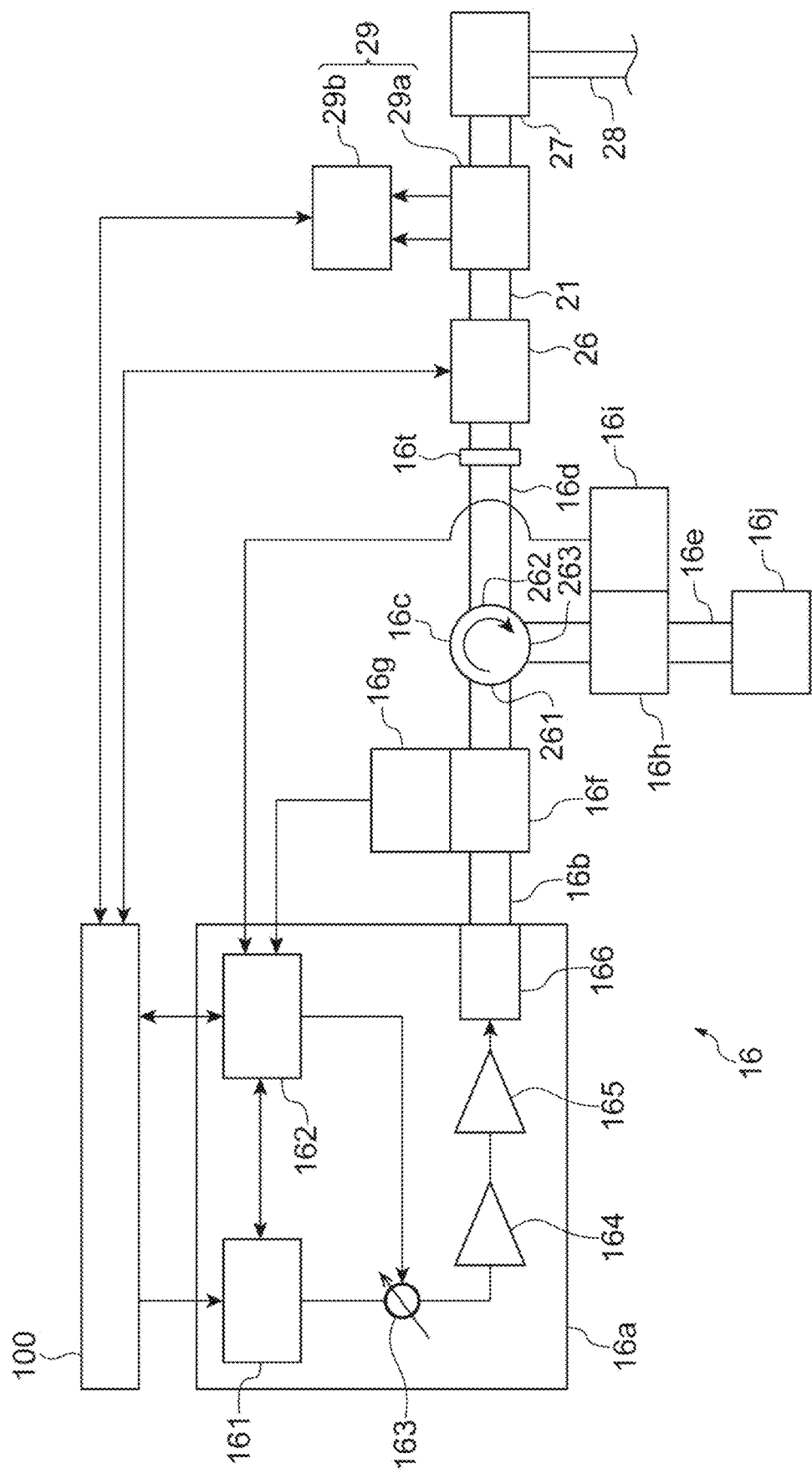
FIG. 2 is a view illustrating an example of a microwave output device, a tuner, and a demodulation unit.

Hereinafter, details of the microwave output device 16, the tuner 26, and the demodulation unit 29 will be described. FIG. 2 is a view illustrating an example of the microwave output device 16, the tuner 26, and the demodulation unit 29. The microwave output device 16 includes a microwave generation unit 16a, a wave guide tube 16b, a circulator 16c, a wave guide tube 16d, a wave guide tube 16e, a first directional coupler 16f, a first measurement unit 16g, a second directional coupler 16h, a second measurement unit 16i, and a dummy load 16j.

The microwave generation unit 16a includes a waveform generation unit 161, a power control unit 162, an attenuator 163, an amplifier 164, an amplifier 165, and a mode converter 166.

The waveform generation unit 161 generates a microwave. For example, the waveform generation unit 161 generates a microwave having a predetermined bandwidth while changing a frequency at a predetermined rate (scanning rate) in a predetermined frequency range. As an example, the waveform generation unit 161 generates a microwave in correspondence with a setting frequency range (for example, an initiation frequency and a termination frequency), a setting modulation mode, a setting bandwidth, and a setting scanning rate which are designated by the controller 100. The modulation mode is a frequency modulation mode, and represents, for example, a time depending waveform of a frequency. Details of the waveform will be described later.

Figure 3:
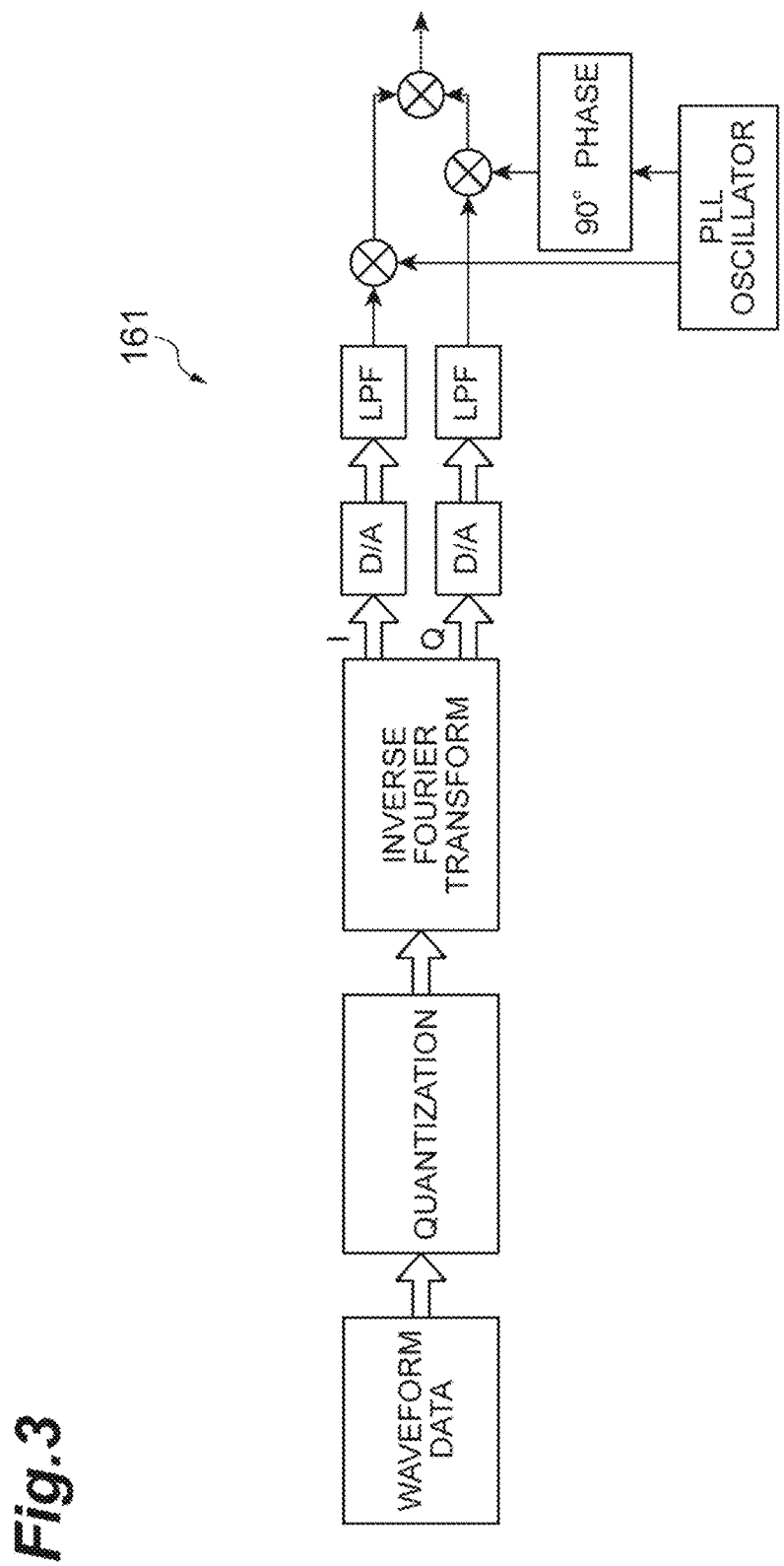
FIG. 3 is a view illustrating a microwave generation principle in an exemplary waveform generation unit.

FIG. 3 is a view illustrating a microwave generation principle in the waveform generation unit. For example, the waveform generation unit 161 includes a phase locked loop (PLL) oscillator that is a radio frequency oscillator, and an IQ digital modulator that is connected to the PLL oscillator. The waveform generation unit 161 sets a frequency of a microwave that is oscillated in the PLL oscillator to a frequency in a setting frequency range designated from the controller 100. In addition, the waveform generation unit 161 modulates a microwave from the PLL oscillator, and a microwave having a phase difference with the microwave from the PLL oscillator by 90° by using the IQ digital modulator. According to this, the waveform generation unit 161 generates a microwave of a frequency in the setting frequency range. The waveform generation unit 161 changes the frequency of the microwave, which is oscillated in the PLL oscillator, at a setting scanning rate designated from the controller 100.

As illustrated in FIG. 3, for example, the waveform generation unit 161 sequentially inputs N pieces of waveform data from the initiation frequency to the termination frequency in correspondence with the scanning rate, and subjects the waveform data to quantization and inverse Fourier transform to generate a frequency-modulated microwave.

In an example, the waveform generation unit 161 has waveform data expressed by a digitalized code row in advance. The waveform generation unit 161 quantizes the waveform data, and applies the inverse Fourier transform to the quantized data to generate In-phase data (I data) and Quadrature data (Q data). In addition, the waveform generation unit 161 applies digital/analog (D/A) conversion to each of the I data and the Q data to obtain two analog signals. The waveform generation unit 161 inputs the analog signals to a low pass filter (LPF) thorough which only a low frequency component is transmitted. The waveform generation unit 161 mixes the two analog signals, which are output from the LPF, with a microwave from the PLL oscillator and a microwave having a phase difference with the microwave from the PLL oscillator by 90°. In addition, the waveform generation unit 161 synthesizes a microwave that is generated through the mixing. According to this, the waveform generation unit 161 generates a frequency-modulated microwave.

The waveform generation unit 161 is not limited to the waveform generation unit that uses the above-described IQ modulation, and may be a waveform generation unit that uses a direct digital synthesizer (DDS) and a voltage controlled oscillator (VCO).

Figure 4A:
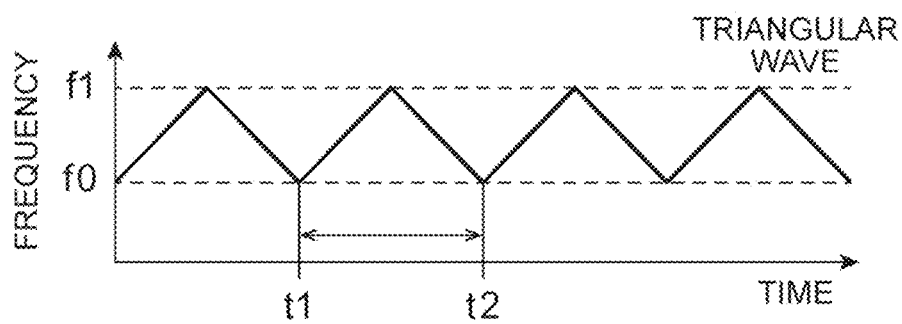
FIGS. 4A to 4C are views illustrating an example of waveform data that is input to the waveform generation unit.
Figure 4B:
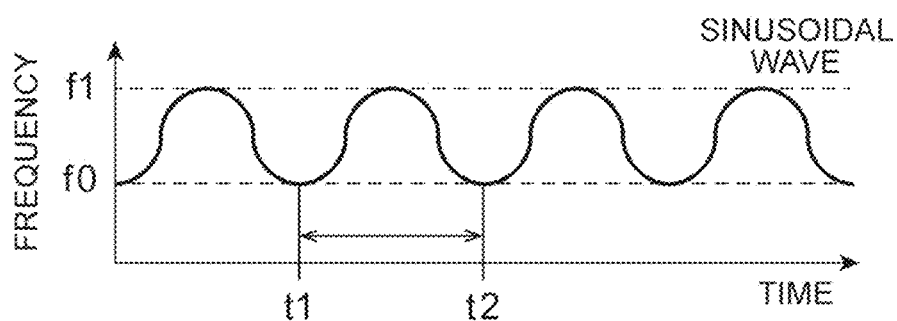
Figure 4C:
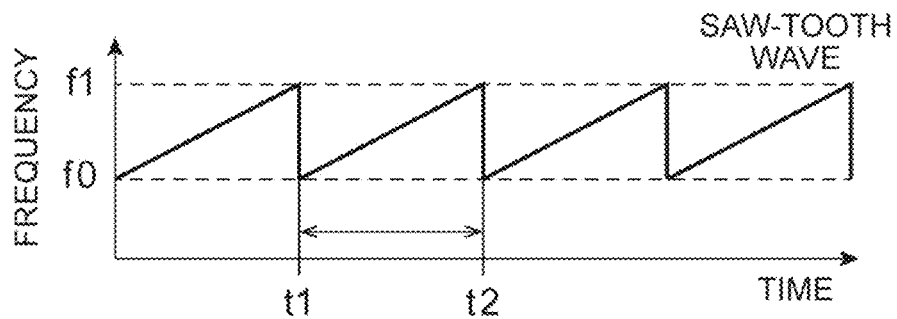

The waveform generation unit 161 inputs waveform data having a waveform of a repetitive period. FIGS. 4A to 4C illustrate an example of the waveform data that is input to the waveform generation unit 161. Data illustrated in FIGS. 4A to 4C is waveform data in which the horizontal axis represents time and the vertical axis represents a frequency, and has a shape such as triangular wave (FIG. 4A), a sinusoidal wave (FIG. 4B), and a saw-tooth wave (FIG. 4C), and the like. The waveform data has a repetitive cycle in which a period from time t1 to time t2 is set as one cycle. The shape of the waveform data is designated as a modulation mode by the controller 100. For example, in a case where a triangular wave modulation mode is designated by the controller 100, the waveform generation unit 161 generates a microwave by using the triangular waveform data illustrated in FIG. 4A.

Figure 5:
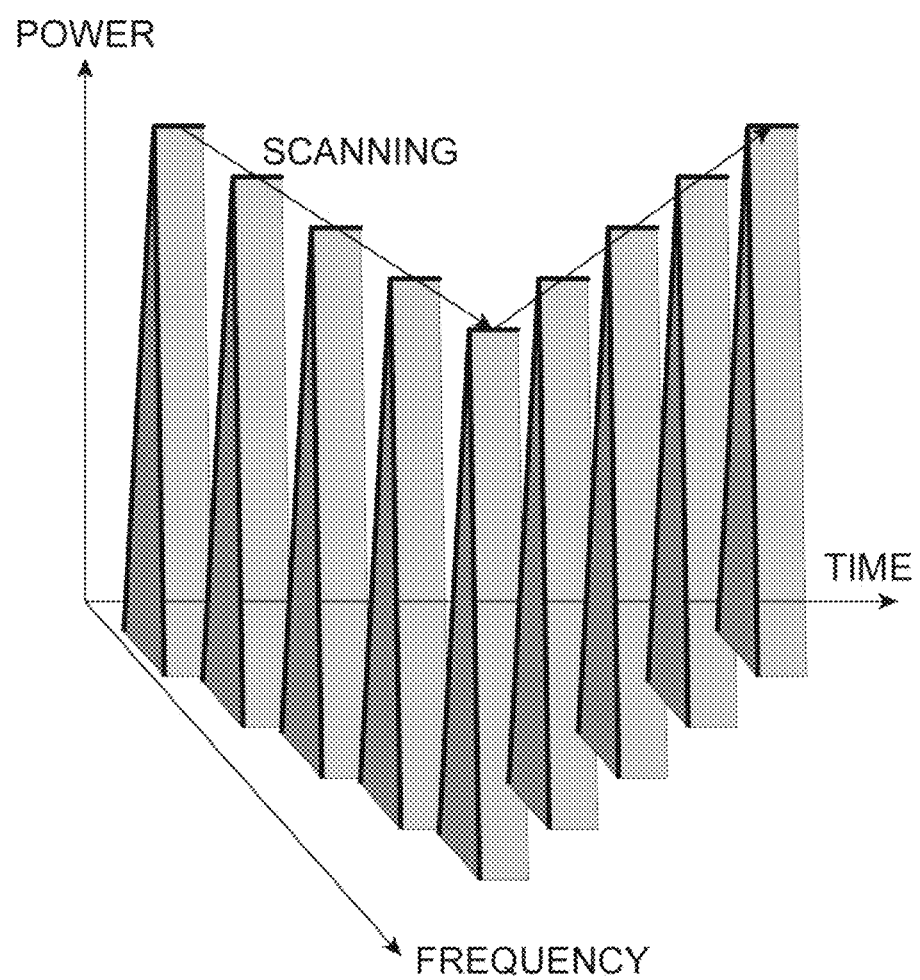
FIG. 5 is a view illustrating an example of a frequency-modulated microwave.

FIG. 5 is a view illustrating a frequency-modulated microwave. As illustrated in FIG. 5, in the frequency-modulated microwave, a single wave shape with predetermined power is frequency-modulated in correspondence with time (scanning rate).

Returning to FIG. 2, an output of the waveform generation unit 161 is connected to the attenuator 163. The power control unit 162 is connected to the attenuator 163. For example, the power control unit 162 may be a processor. The power control unit 162 controls an attenuation rate of a microwave in the attenuator 163 so that a microwave having power corresponding to setting power designated from the controller 100 is output from the microwave output device 16. The output of the attenuator 163 is connected to the mode converter 166 through the amplifier 164 and the amplifier 165. The amplifier 164 and the amplifier 165 are configured to amplify a microwave at a predetermined amplification rate. The mode converter 166 is configured to convert a mode of the microwave output from the amplifier 165. A microwave, which is generated through the mode conversion in the mode converter 166, is output as an output microwave of the microwave generation unit 16a.

An output of the microwave generation unit 16a is connected to one end of the wave guide tube 16b. The other end of the wave guide tube 16b is connected to a first port 261 of the circulator 16c. The circulator 16c includes a first port 261, a second port 262, and a third port 263. The circulator 16c is configured to output a microwave, which is input to the first port 261, from the second port 262, and to output a microwave, which is input to the second port 262, from the third port 263. One end of the wave guide tube 16d is connected to the second port 262 of the circulator 16c. The other end of the wave guide tube 16d is an output unit 16t of the microwave output device 16.

One end of the wave guide tube 16e is connected to the third port 263 of the circulator 16c. The other end of the wave guide tube 16e is connected to the dummy load 16j.

The dummy load 16j is configured to receive a microwave that propagates through the wave guide tube 16e and to absorb the microwave. For example, the dummy load 16j converts the microwave into heat.

The first directional coupler 16f is configured to branch parts of microwaves (that is, travelling waves) which are output from the microwave generation unit 16a and propagate to the output unit 16t, and to output the parts of the travelling waves. The first measurement unit 16g determines a first measurement value, which represents power of the travelling waves at the output unit 16t, on the basis of parts of the travelling waves which are output from the first directional coupler 16f.

The second directional coupler 16h is configured to branch parts of microwaves (that is, reflected waves) which return to the output unit 16t, and to output the parts of the reflected waves. The second measurement unit 16i determines a second measurement value, which represents power of the reflected waves at the output unit 16t, on the basis of the parts of the reflected waves which are output from the second directional coupler 16h.

The first measurement unit 16g and the second measurement unit 16i are connected to the power control unit 162. The first measurement unit 16g outputs a first measurement value to the power control unit 162, and the second measurement unit 16i outputs a second measurement value to the power control unit 162. The power control unit 162 controls the attenuator 163 so that a difference between the first measurement value and the second measurement value, that is, load power matches the setting power that is designated by the controller 100, and controls the waveform generation unit 161 as necessary.

The first directional coupler 16f is provided between one end and the other end of the wave guide tube 16b. The second directional coupler 16h is provided between one end and the other end of the wave guide tube 16e. Furthermore, the first directional coupler 16f may be provided between one end and the other end of the wave guide tube 16d, or both of the first directional coupler 16f and the second directional coupler 16h may be provided between one end and the other end of the wave guide tube 16d.

The tuner 26 is provided in the wave guide tube 21. The tuner 26 adjusts a protrusion position of the movable plate so that impedance on the microwave output device 16 side and impedance on the antenna 18 side match each other on the basis of a signal of the controller 100. The tuner 26 operates the movable plate by a driver circuit and an actuator (both are not illustrated). Furthermore, adjustment of the protrusion position of the movable plate may be realized by a stub structure.

For example, the demodulation unit 29 is provided between the tuner 26 and the antenna 18 in the wave guide tube 21. The demodulation unit 29 acquires travelling wave power that is power of a travelling wave that travels through the wave guide tube 21, and reflected wave power that is power of a reflected wave from the antenna 18 side for each frequency. Furthermore, the demodulation unit 29 may be provided between the circulator 16c (the second port 262) and the tuner 26 in the wave guide tube 21.

The demodulation unit 29 includes a directional coupler 29a and a demodulation control unit 29b. The directional coupler 29a is a bidirectional coupler including four ports. The directional coupler 29a is configured to branch a part of microwaves (that is, travelling waves) which are output from the microwave generation unit 16a and propagate through the wave guide tube 21, and to output the part of the travelling waves. Similarly, the directional coupler 29a is configured to branch a part of microwaves (that is, reflected waves), which are returned from the mode converter 27, and to output the part of the reflected wave.

The demodulation control unit 29b is a computing unit including a processor and a memory. The demodulation control unit 29b measures travelling wave power Pf in the directional coupler 29a on the basis of the part of the travelling waves which is output from the directional coupler 29a. Similarly, the demodulation control unit 29b measures reflected wave power Pr in the directional coupler 29a on the basis of the part of the reflected waves which is output from the directional coupler 29a.

Hereinafter, two configuration examples will be disclosed with respect to the demodulation control unit 29b.

Demodulation Control Unit 29b in First Example

Figure 6:
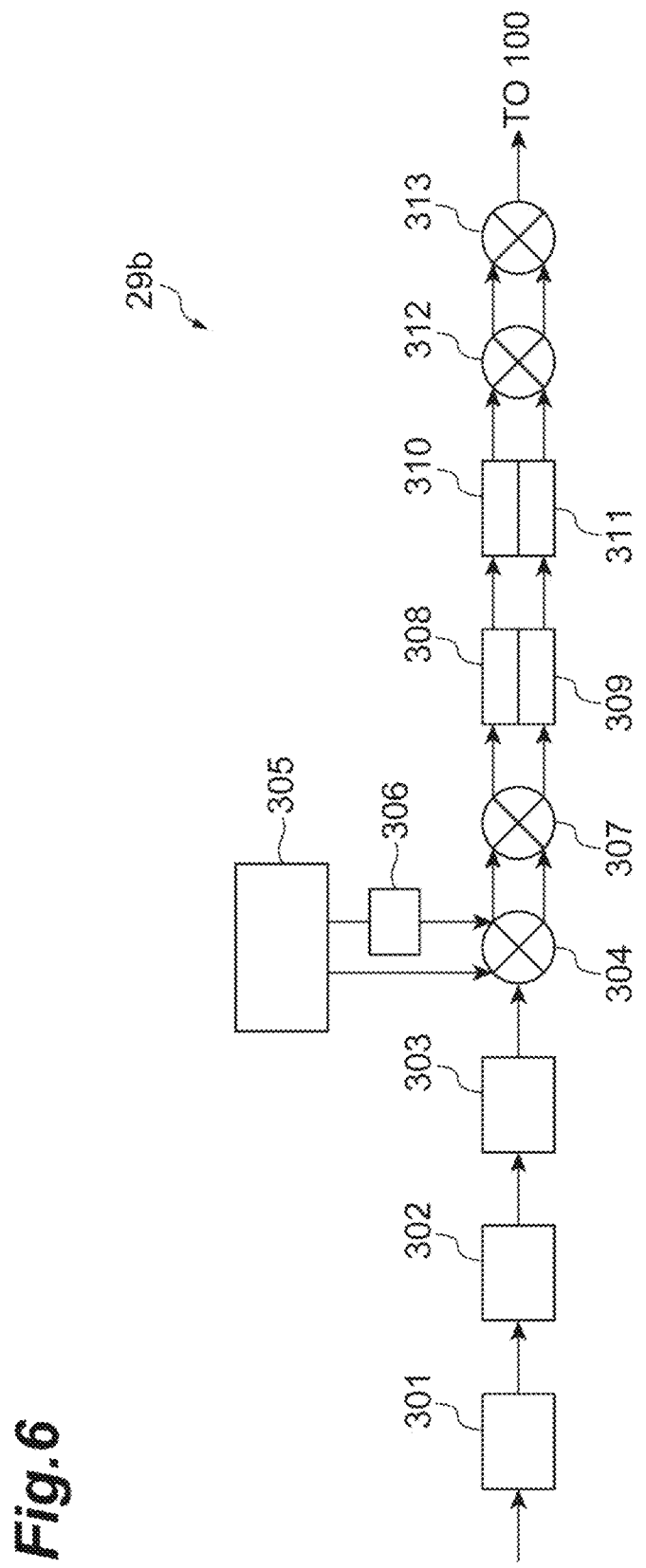
FIG. 6 is a configuration diagram of a demodulation control unit of a first example.

FIG. 6 is a configuration diagram of the demodulation control unit 29b in the first example. The demodulation control unit 29b in the first example performs IQ demodulation. As illustrated in FIG. 6, the demodulation control unit 29b in the first example includes an attenuator 301, an RF switch 302, a band-pass filter 303, a mixer 304, a PLL oscillator 305, a frequency shifter 306, a mixer 307, low-pass filters 308 and 309, A/D converters 310 and 311, a mixer 312 (for fast Fourier transform (FFT)) and a mixer 313 (for parallel-serial conversion).

The attenuator 301, the RF switch 302, the band-pass filter 303, the mixer 304, the PLL oscillator 305, the frequency shifter 306, the mixer 307, the low-pass filters 308 and 309, the A/D converters 310 and 311, and the mixers 312 and 313 constitute a first spectrum analysis unit. The first spectrum analysis unit calculates digital values Pf(f) and Pr(f) which respectively correspond to the travelling wave power and the reflected wave power.

A part of the travelling waves or a part of the reflected waves, which is output from the directional coupler 29a, is input to an input of the attenuator 301. Analog signals, which are attenuated by the attenuator 301, are filtered into predetermined signals by the RF switch 302 and the band-pass filter 303. The resultant filtered signals are mixed by the mixers 304 and 307 by using a microwave from the PLL oscillator 305 and a microwave to which a phase difference of 90° is applied by the frequency shifter 306, and are modulated into an I signal and a Q signal. The I signal and the Q signal are respectively filtered by the low-pass filters 308 and 309, and are converted into digital signals by the A/D converters 310 and 311. The digital-converted I signal and Q signal are subjected to discrete fast Fourier transform in the mixer 312, and digital values Pf(f) and Pr(f), which are parallel-serial converted in the mixer 313, are output. The digital values Pf(f) and Pr(f) represent the travelling wave power Pf or the reflected wave power Pr which are correlated with a frequency f. The travelling wave power or the reflected wave power, which are correlated with the frequency, is output to the controller 100.

Demodulation Control Unit 29b in Second Example

Figure 7:
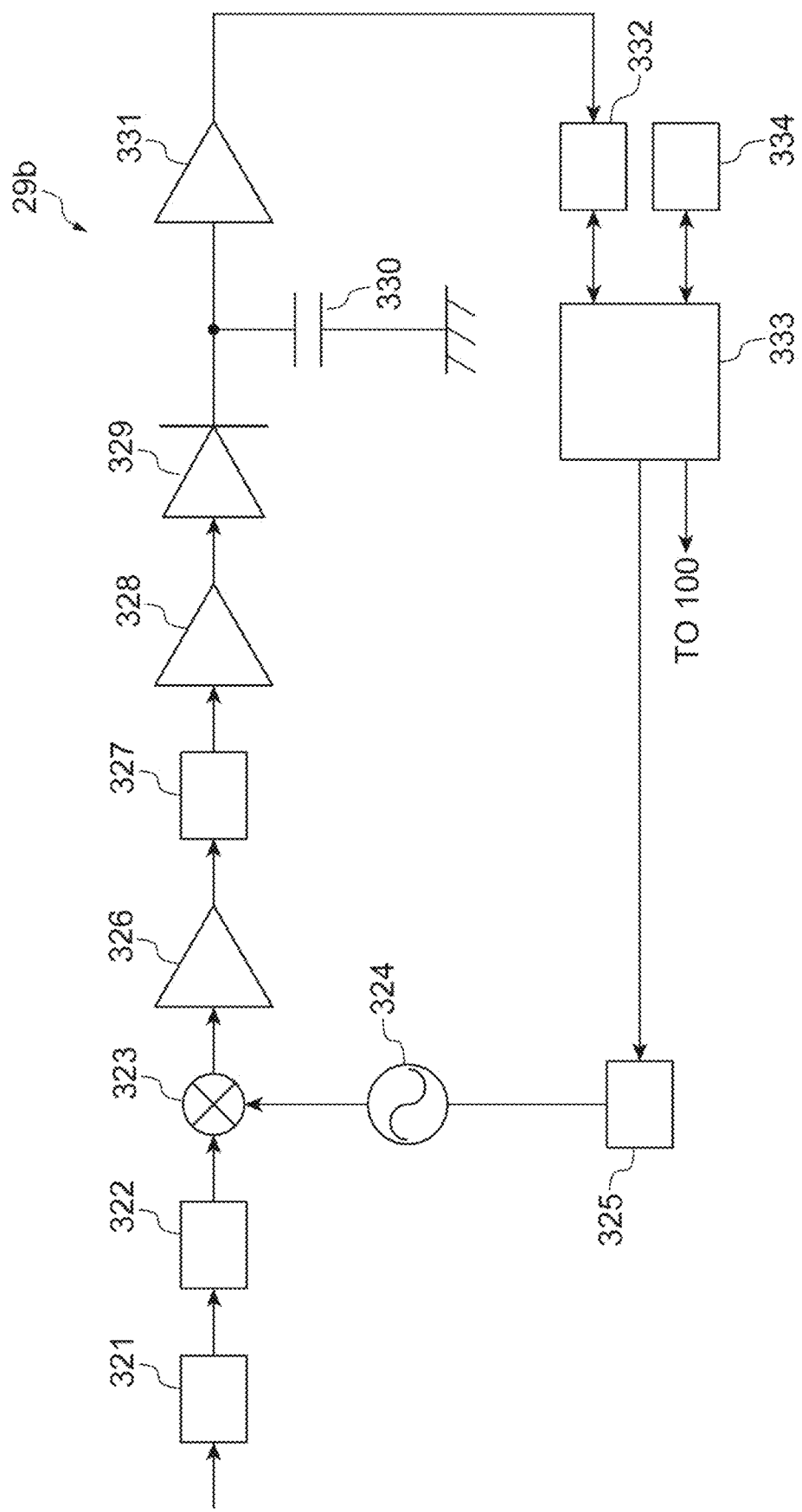
FIG. 7 is a configuration diagram of a demodulation control unit of a second example.

FIG. 7 is a configuration diagram of the demodulation control unit 29b in a second example. The demodulation control unit 29b in the second example performs demodulation in a superheterodyne mode. As illustrated in FIG. 7, the demodulation control unit 29b in the second example includes an attenuator 321, a low-pass filter 322, a mixer 323, a local oscillator 324, a frequency sweep controller 325, an IF amplifier 326 (intermediate frequency amplifier), an IF filter 327 (intermediate frequency filter), a log amplifier 328, a diode 329, a capacitor 330, a buffer amplifier 331, an A/D converter 332, and a second processing unit 333.

The attenuator 321, the low-pass filter 322, the mixer 323, the local oscillator 324, the frequency sweep controller 325, the IF amplifier 326, the IF filter 327, the log amplifier 328, the diode 329, the capacitor 330, the buffer amplifier 331, and the A/D converter 332 constitute a second spectrum analysis unit. The second spectrum analysis unit calculates digital values Pf(f) and Pr(f) which respectively correspond to the travelling wave power or the reflected wave power.

A part of the travelling waves or a part of the reflected waves, which is output from the directional coupler 29a, is input to an input of the attenuator 321. Analog signals, which are attenuated by the attenuator 321, are filtered in the low-pass filter 322. The filtered signals, which are filtered in the low-pass filter 322, are input to the mixer 323. On the other hand, the local oscillator 324 changes a frequency of a signal that is transmitted under a control of the frequency sweep controller 325 so as to convert a frequency component into a signal of a predetermined frequency in a partial band of the part of the travelling waves or the part of the reflected waves which is input to the attenuator 321. The mixer 323 mixes a signal from the low-pass filter 322 and a signal from the local oscillator 324 to generate a signal of a predetermined frequency.

A signal from the mixer 323 is amplified by the IF amplifier 326, and the signal amplified by the IF amplifier 326 is filtered in the IF filter 327. A signal filtered in the IF filter 327 is amplified in the log amplifier 328. A signal, which is amplified in the log amplifier 328, is converted into an analog signal (voltage signal) through rectification by the diode 329, smoothing by the capacitor 330, and amplification by the buffer amplifier 331. In addition, an analog signal from the buffer amplifier 331 is converted into a digital value Pf(f) or a digital value Pr(f) by the A/D converter 332. The digital values represent the travelling wave power or the reflected wave power. A digital value, which is calculated in the second spectrum analysis unit, is input to the second processing unit 333.

The second processing unit 333 includes a processor such as a CPU. A storage device 334 is connected to the second processing unit 333. In an example, the storage device 334 stores a second correction coefficient that is set in advance in correlation with a frequency. A plurality of the second correction coefficients are coefficients for correcting the digital value Pf(f) or the digital value Pr(f) with the travelling wave power or the reflected wave power. The second processing unit 333 outputs the travelling wave power or the reflected wave power, which is correlated with a frequency, to the controller 100.

Furthermore, as to be described later, in a case of calculating the absorption frequency from a minimum value of the reflected wave power, the demodulation unit 29 may be configured to acquire only the reflected wave power. In this case, the directional coupler 29a is a unidirectional coupler that branches only the reflected wave similar to the second directional coupler 16h, and the demodulation control unit 29b measures only the reflected wave power Pr.

Travelling Wave Power and Reflected Wave Power

Hereinafter, description will be given of a relationship between power of a travelling wave output from the waveform generation unit 161, power of a travelling wave output from the microwave generation unit 16a, and travelling wave power and reflected wave power which are measured in the demodulation unit 29.

FIGS. 8A to 8G illustrate an example of the travelling wave power and the reflected wave power in respective constituent elements. In respective graphs of FIGS. 8A to 8G, the horizontal axis represents a frequency and the vertical axis represents power. A graph of FIG. 8A illustrates frequency dependency of a power spectrum of the travelling wave (before amplification) output by the waveform generation unit 161. As illustrated in the graph of FIG. 8A, travelling wave power Pfa of the travelling wave output from the waveform generation unit 161 is a constant value, and is subjected to frequency modulation as indicated by an arrow in the drawing in a frequency range from an initiation frequency f0 to a termination frequency f1. Furthermore, the graph in FIG. 8A is a graph that is obtained by sweep averaging. The sweep averaging is a method of obtaining a spectrum by sequentially changing a frequency by using a sinusoidal signal.

A graph of FIG. 8B illustrates frequency dependency of a power spectrum of the travelling wave (after amplification) output by the microwave generation unit 16a. As illustrated in the graph of FIG. 8B, travelling wave power Pfb of the travelling wave output from the microwave generation unit 16a is further amplified by the amplifier 164, the amplifier 165, and the like in comparison to the travelling wave power Pfa of the travelling wave output from the waveform generation unit 161. Furthermore, the graph of FIG. 8B is a graph that is obtained by the sweep averaging. As is the case with the graph of FIG. 8B, a graph of FIG. 8C is a graph that illustrates frequency dependency of a power spectrum of the travelling wave (after amplification) output by the microwave generation unit 16a, and is obtained by using a maximum hold function. The maximum hold function is a function of performing plotting with a maximum value retained. As illustrated in FIG. 8C, it is possible to obtain a waveform of the travelling wave power Pfc of the travelling wave output from the microwave generation unit 16a.

A graph of FIG. 8D illustrates frequency dependency of a power spectrum of the travelling wave obtained by the demodulation unit 29, and is a graph of travelling wave power Pfd that is obtained by sweep averaging, and a graph of FIG. 8E illustrates frequency dependency of the power spectrum of the travelling wave obtained by the demodulation unit 29, and is a graph of travelling wave power Pfe obtained by using the maximum hold function.

A graph of FIG. 8F illustrates frequency dependency of a power spectrum of the reflected wave obtained by the demodulation unit 29, and is a graph of reflected wave power Pra obtained by the sweep averaging, and a graph of FIG. 8G illustrates frequency dependency of the power spectrum of the reflected wave obtained by the demodulation unit 29, and is a graph of reflected wave power Prb obtained by using the maximum hold function.

When comparing a waveform illustrated in the graph of FIG. 8C and a waveform illustrated in the graph of FIG. 8E, it can be seen that the travelling wave output by the microwave generation unit 16a reaches the demodulation unit 29 without loss. In addition, when comparing a waveform illustrated in the graph of FIG. 8E and a waveform illustrated in the graph of FIG. 8G, it is possible to understand the degree of reflection of the microwave.

Waveform Acquired in Demodulation Unit 29

Details of a waveform acquired in the demodulation unit 29 will be described. FIGS. 9A to 9C illustrate an example of travelling wave power acquired in the demodulation unit 29. In respective graphs in FIGS. 9A to 9C, the horizontal axis represents a frequency and the vertical axis represents power. As illustrated in a plurality of graphs of FIG. 9A, in a frequency range of 2400 MHz to 2500 MHz, travelling wave power Pf(n) (n is a natural number) is acquired for each frequency. As illustrated in FIG. 9A, n power spectrums of Pf(1) to Pf(n) are sequentially acquired while changing the frequency. A graph of FIG. 9B is obtained by merging the n power spectrums of Pf(1) to Pf(n). A graph of FIG. 9C is obtained by plotting the n power spectrums of Pf(1) to Pf(n) by using the maximum hold function. As described above, the demodulation unit 29 performs detection by correlating the frequency and the travelling wave power Pf with each other.

Figure 10A:
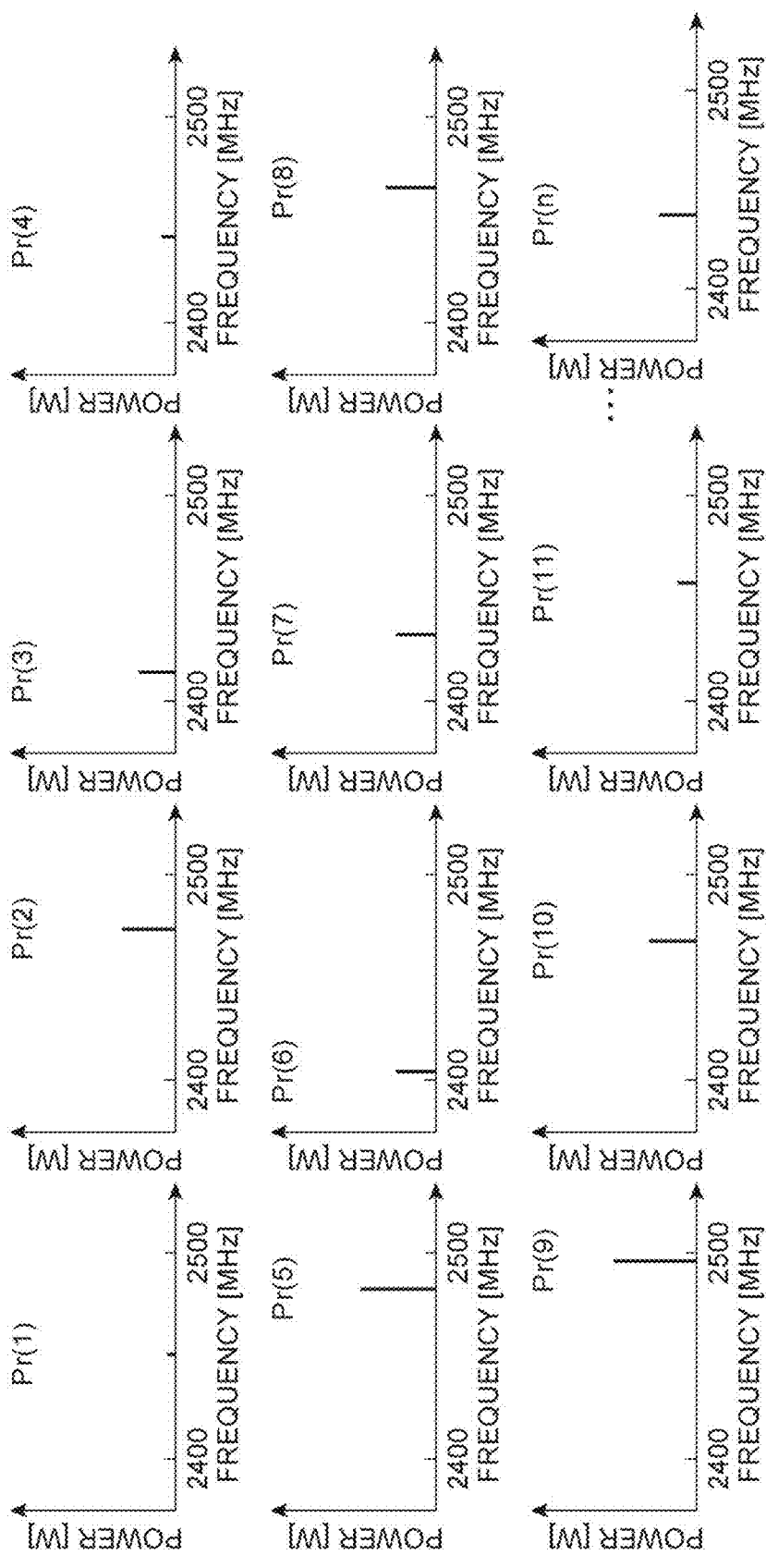
FIGS. 10A to 10C are views illustrating an example of the reflected wave power that is acquired in the demodulation unit.
Figure 10B:
Figure 10C:
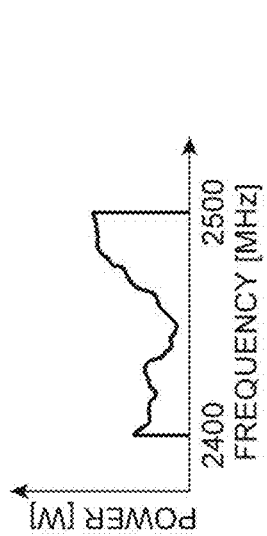

FIGS. 10A to 10C illustrate an example of the reflected wave power acquired in the demodulation unit 29. In graphs of FIGS. 10A to 10C, the horizontal axis represents a frequency, and the vertical axis represents power. As illustrated in a plurality of graphs of FIG. 10A, in a frequency range of 2400 MHz to 2500 MHz, reflected wave power Pr(n) (n is a natural number) is acquired for each frequency. N power spectrums of Pr(1) to Pr(n) are sequentially acquired while changing the frequency. A graph of FIG. 10B is obtained by merging the n power spectrums of Pr(1) to Pr(n). A graph of FIG. 10C is obtained by plotting the n power spectrums of Pr(1) to Pr(n) by using the maximum hold function. As described above, the demodulation unit 29 performs detection by correlating the frequency and the reflected wave power Pr with each other.

Correction of Travelling Wave Power and Reflected Wave Power

Figure 11A:
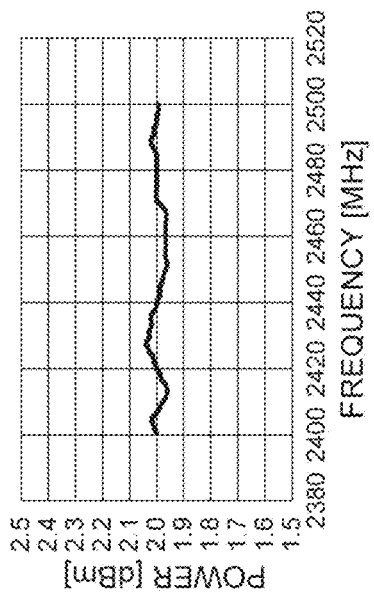
FIGS. 11A to 11E are views illustrating an influence on the travelling wave power and the reflected wave power due to providing of the demodulation unit.
Figure 11B:
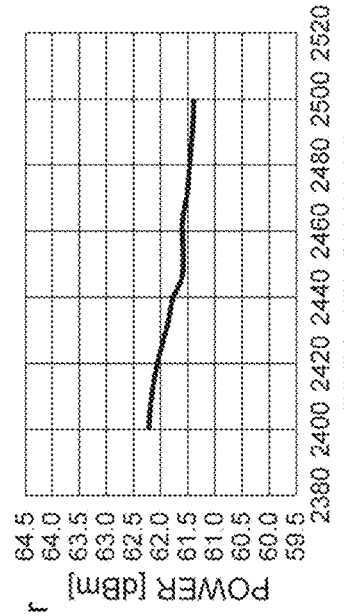
Figure 11C:
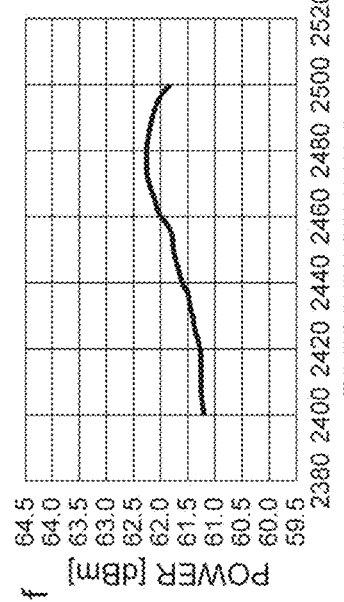
Figure 11D:
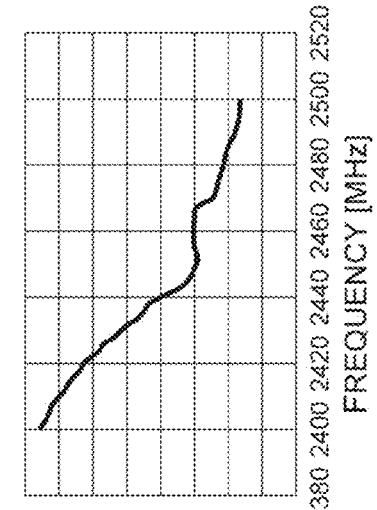
Figure 11E:
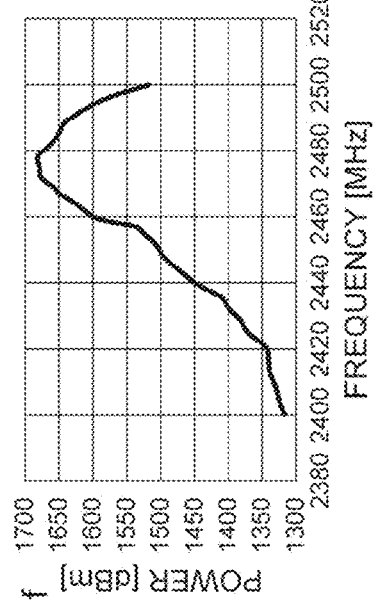

Waveforms obtained in FIGS. 9A to 9C and FIGS. 10A to 10C are influenced due to providing of the demodulation unit 29. Specifically, a waveform of power is influenced by disposition of the directional coupler 29a of the demodulation unit 29, and frequency characteristics of a demodulation circuit of the demodulation control unit 29b. FIGS. 11A to 11E are views illustrating an influence on the travelling wave power and the reflected wave power due to providing of the demodulation unit 29. In graphs of FIGS. 11A to 11E, the horizontal axis represents a frequency and the vertical axis represents power. In addition, setting power of the travelling wave is a constant value (here, 1500 W). A graph of FIG. 11A illustrates frequency dependency of a power spectrum of a travelling wave (before amplification) output by the waveform generation unit 161. Graphs of FIGS. 11B and 11C illustrate frequency dependency of a power spectrum of a travelling wave obtained by the demodulation unit 29. In the graph of FIG. 11B, the power is shown in a decibel unit, and in the graph of FIG. 11C, the power is shown in a watt unit. Graphs of FIGS. 11D and 11E illustrate frequency dependency of a power spectrum of a reflected wave obtained by the demodulation unit 29. In the graph of FIG. 11D, the power is shown in a decibel unit, and in the graph of FIG. 11E, the power is shown in a watt unit.

In a case where a setting power is constant, the travelling wave power is required to be flat without depending on the frequency, and is typically required to have accuracy of approximately ±1 W in terms of watt. As illustrated in the graph of FIG. 11A, the travelling wave power Pf of the travelling wave, which is output by the waveform generation unit 161, is approximately 2.0 dBm and is approximately constant. As illustrated in the graph of FIG. 11B, a slight fluctuation exists in travelling wave power Pf measured in the demodulation unit 29. As illustrated in the graph of FIG. 11C, in a case where the travelling wave power Pf is converted into watt, it can be seen that the travelling wave power Pf fluctuates in a range of 1300 W to 1700 W with respect to the setting power of 1500 W. Similarly, as illustrated in the graph of FIG. 11D, a slight fluctuation exists in reflected wave power Pr measured in the demodulation unit 29. As illustrated in the graph of FIG. 11E, in a case where the reflected wave power Pr is converted into watt, it can be seen that the reflected wave power Pr fluctuates in a range of 1300 W to 1700 W with respect to the setting power of 1500 W.

Figure 12A:
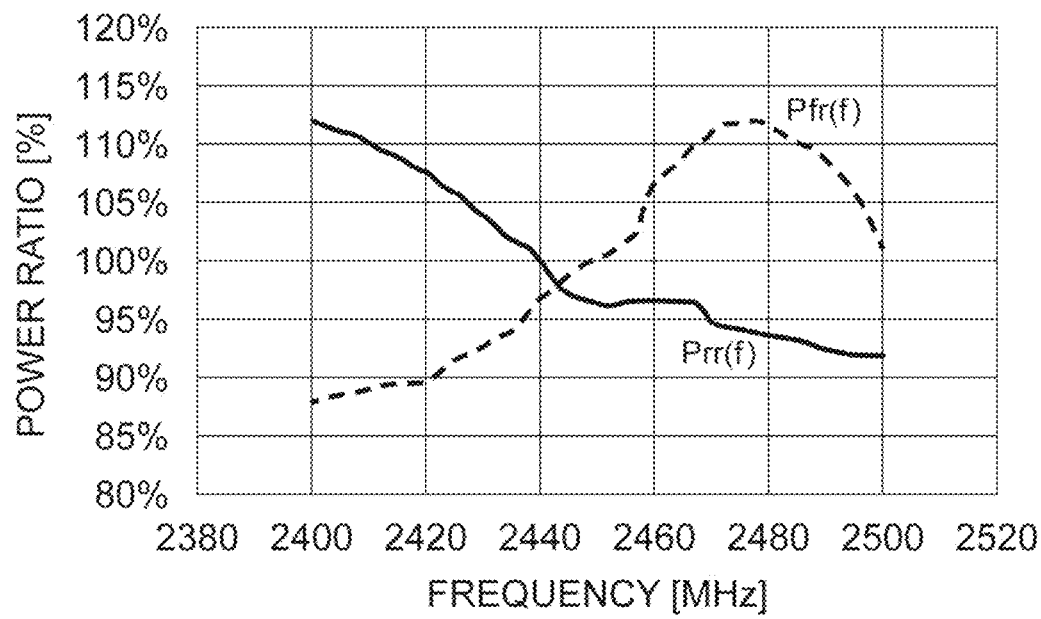
FIGS. 12A and 12B are graphs illustrating a power ratio and a correction coefficient of each of the travelling wave power and the reflected wave power.
Figure 12B:
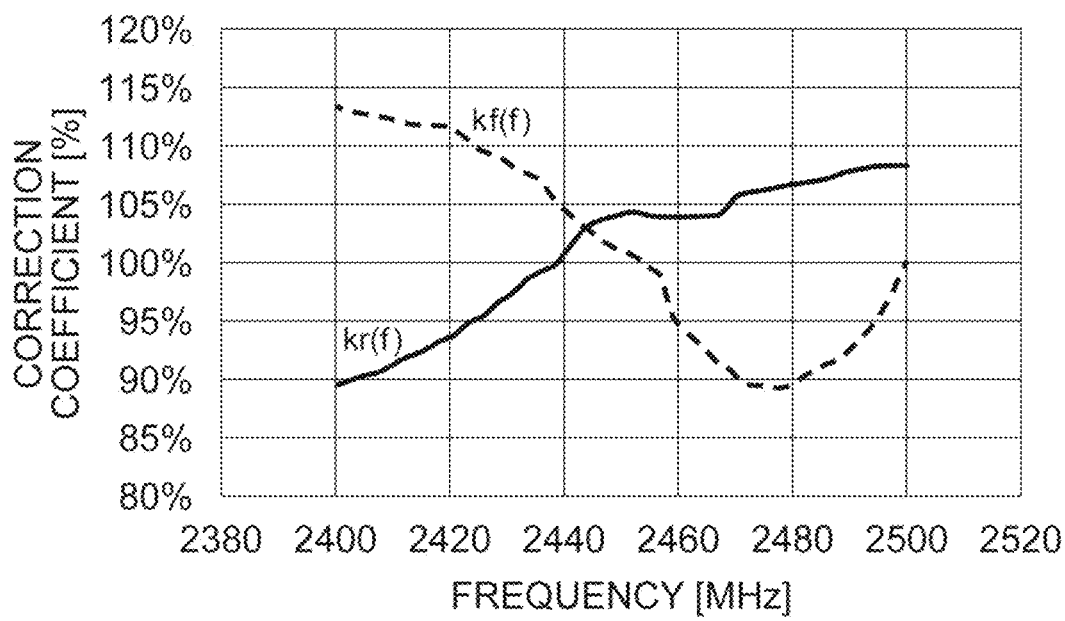

FIGS. 12A and 12B are graphs illustrating a power ratio and a correction coefficient of each of the travelling wave power and the reflected wave power. In the graph of FIG. 12A, the horizontal axis represents a frequency and the vertical axis represents the power ratio. The power ratio is obtained by standardizing the graph of FIG. 11C so that the power ratio becomes 100% when the power is 1500 W. In the graph of FIG. 12A, a power ratio Pfr(f) of the travelling wave power is indicated by a broken line, and a power ratio Prr(f) of the reflected wave power is indicated by a solid line. In the graph of FIG. 12B, the horizontal axis represents a frequency and the vertical axis represents the correction coefficient. The correction coefficient is a coefficient that becomes 100% through integration to the power ratio illustrated in FIG. 12A. In the graph of FIG. 12B, a correction coefficient kf(f) of the power ratio Pfr(f) of the travelling wave power is indicated by a broken line, and a correction coefficient kr(f) of the power ratio Prr(f) of the reflected wave power is indicated by a solid line. The correction coefficient kf(f) is a reciprocal number of the power ratio Pfr(f). Similarly, the correction coefficient kr(f) is a reciprocal number of the power ratio Prr(f). In this manner, it is possible to perform correction of the travelling wave power and the reflected wave power by using the correction coefficients kf(f) and kr(f).

Figure 13:
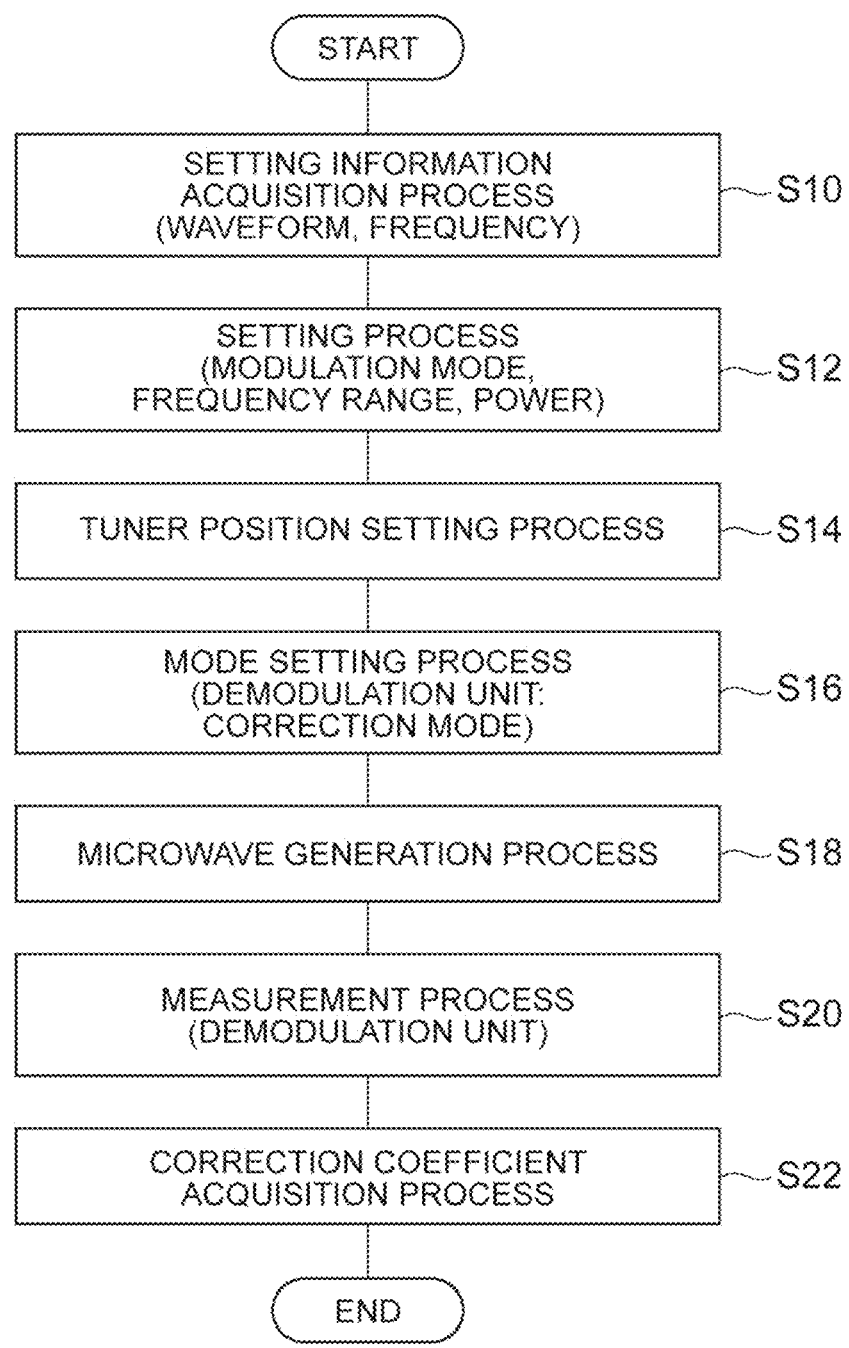
FIG. 13 is a flowchart illustrating an example of a correction coefficient acquisition process.

FIG. 13 is a flowchart of a correction coefficient acquisition process. The flowchart illustrated in FIG. 13 is executed by the controller 100, and the process is initiated, for example, in response to an initiation operation by an apparatus manager. In addition, the flowchart is executed with respect to each of the travelling wave and the reflected wave. Hereinafter, description will be given of an example of calculating the correction coefficient of the travelling wave power of the travelling wave.

As illustrated in FIG. 13, as a setting information acquisition process (S10), the controller 100 acquires a waveform and a frequency of the travelling wave power Pf. For example, the controller 100 acquires the waveform and the frequency from the apparatus manager thorough a user interface.

Next, as a setting process (S12), the controller 100 sets a modulation mode, a frequency range, and power. The controller 100 determines the modulation mode and the frequency range from the waveform and the frequency which are acquired in the setting information acquisition process (S10), and outputs the modulation mode and the frequency range, which are determined, to the waveform generation unit 161. The controller 100 outputs predetermined power to the power control unit 162.

Next, as a tuner position setting process (S14), the controller 100 operates the tuner 26. The controller 100 moves the movable plate 26a and the movable plate 26b of the tuner 26 to a position at which impedance matching occurs.

Next, as a mode setting process (S16), the controller 100 performs setting to a mode of acquiring a correction coefficient of a travelling wave. The controller 100 outputs a command to the demodulation unit 29 to acquire the travelling wave. Next, as a microwave generation process (S18), the controller 100 outputs a microwave to the microwave generation unit 16a.

When the microwave is output, as a measurement process (S20), the demodulation unit 29 acquires frequency dependency of the travelling wave power Pf. For example, the demodulation unit 29 acquires the graph of FIG. 11C.

Next, as a correction coefficient acquisition process (S22), the controller 100 acquires the correction coefficient kf(f) on the basis of the frequency dependency of the travelling wave power Pf that is obtained in the measurement process (S20). For example, as illustrated in the graph of FIG. 12A, the controller 100 standardizes the travelling wave power Pf, which is obtained in the measurement process (S20), with the setting power for conversion into a power ratio, thereby obtaining the frequency-dependent power ratio Pfr(f). In addition, the controller 100 sets a reciprocal number of the power ratio Pfr(f) to the correction coefficient kf(f). As described above, the correction coefficient acquisition process illustrated in FIG. 13 is terminated.

A process of acquiring the correction coefficient kr(f) of the reflected wave power Pr of the reflected wave is the same as in the example of acquiring the correction coefficient kf(f) of the travelling wave power Pf of the travelling wave, and thus description thereof will not be repeated.

Figure 14C:
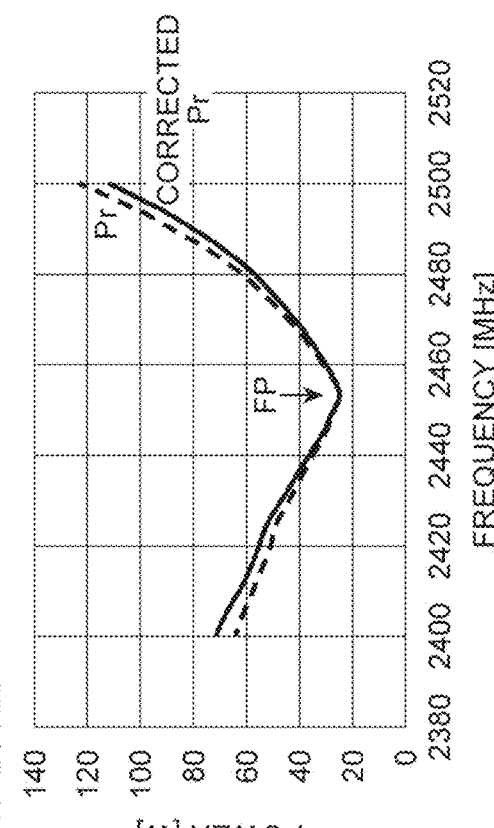
FIGS. 14A to 14D are views illustrating an example of reflected wave power before and after correction with respect to the travelling wave power.
Figure 14D:
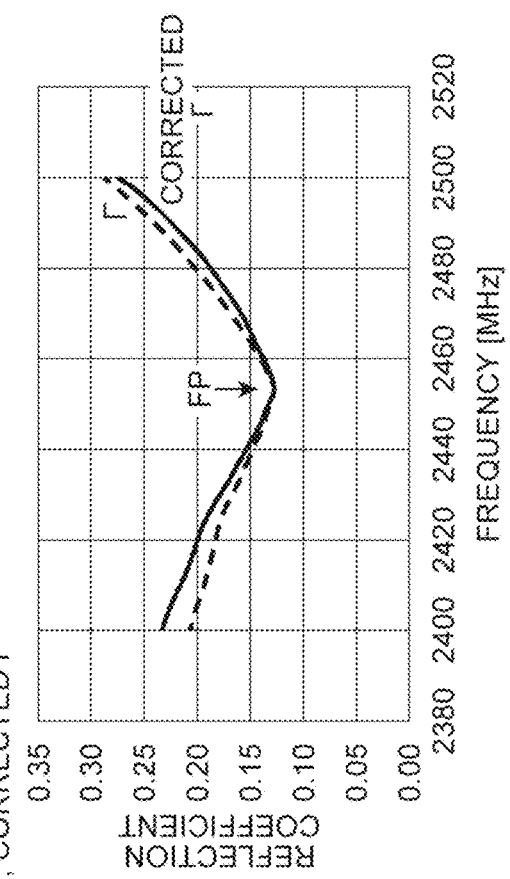
Figure 14A:
Figure 14B:
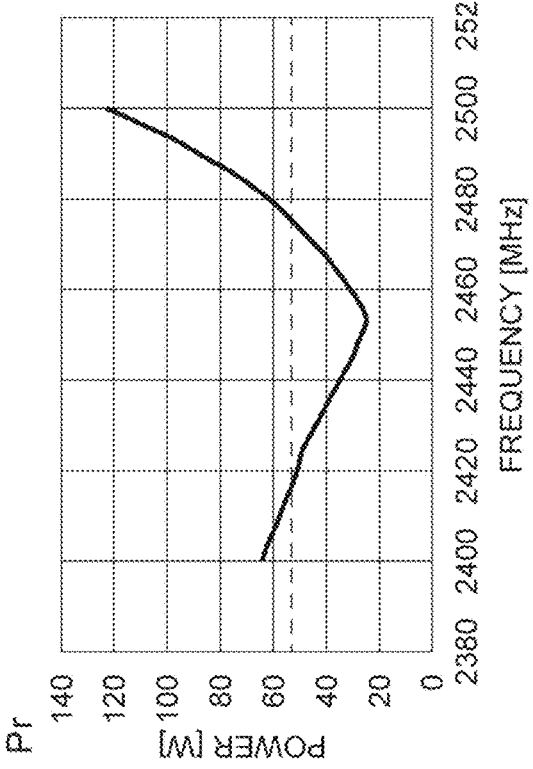

The controller 100 corrects the travelling wave power Pf and the reflected wave power Pr by using the correction coefficients kf(f) and kr(f) which are obtained (correction process). Hereinafter, description will be given of the correction process of the reflected wave power Pr as an example. FIGS. 14A to 14D illustrate an example of the reflected wave power before and after correction with respect to the travelling wave power. In the graph of FIG. 14A, the horizontal axis represents a frequency and the vertical axis represents power. The graph of FIG. 14A illustrates frequency dependency of a power spectrum of the travelling wave (after amplication) output by the microwave generation unit 16a (setting power is 1500 W). A graph of the reflected wave power, which is obtained at this time, is FIG. 14B. In the graph of FIG. 14B, the horizontal axis represents a frequency and the vertical axis represents power. The graph of FIG. 14B represents frequency dependency of a power spectrum of the reflected wave that is obtained by the demodulation unit 29.

The controller 100 integrates the correction coefficient kr(f), which is obtained in the correction coefficient acquisition process of FIG. 13, to the reflected wave power illustrated in the graph of FIG. 14B. According to this, as illustrated in the graph of FIG. 14C, it is possible to obtain corrected reflected wave power Pr (corrected Pr). When using the corrected reflected wave power Pr, it is possible to more accurately calculate the absorption frequency FP in comparison to a case of using the reflected wave power Pr before correction. The absorption frequency FP represents a frequency at which the reflected wave power becomes a minimum value. Furthermore, the graph of FIG. 14D is obtained by converting the graph of FIG. 14C. In the graph of FIG. 14D, the horizontal axis represents a frequency and the vertical axis represents a reflection coefficient. The reflection coefficient is a standardized coefficient by setting the total reflection to "1". When executing a correction process, accuracy of the reflection coefficient is also improved.

Figure 15:
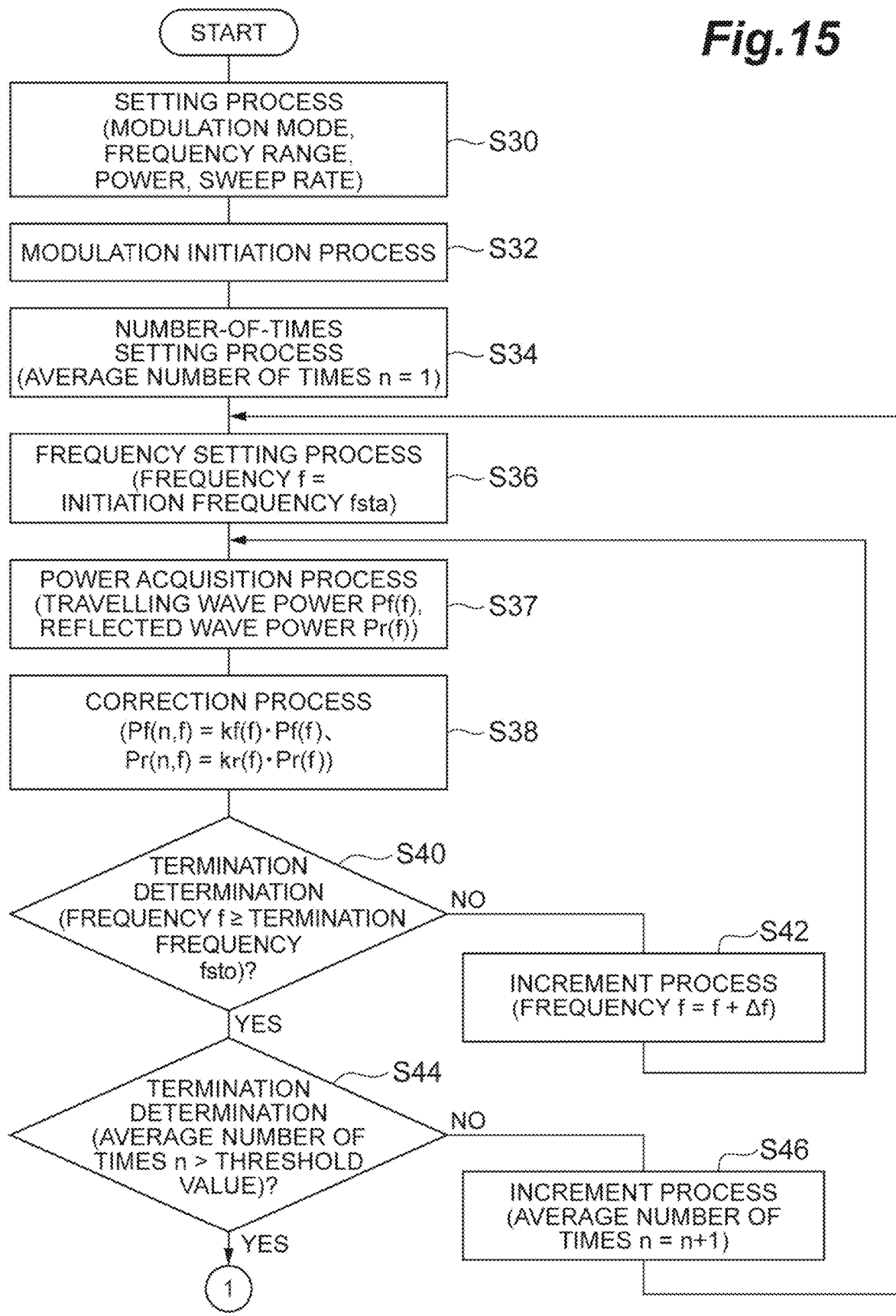
FIG. 15 is a flowchart illustrating an example of a reflection coefficient calculation process.
Figure 16:
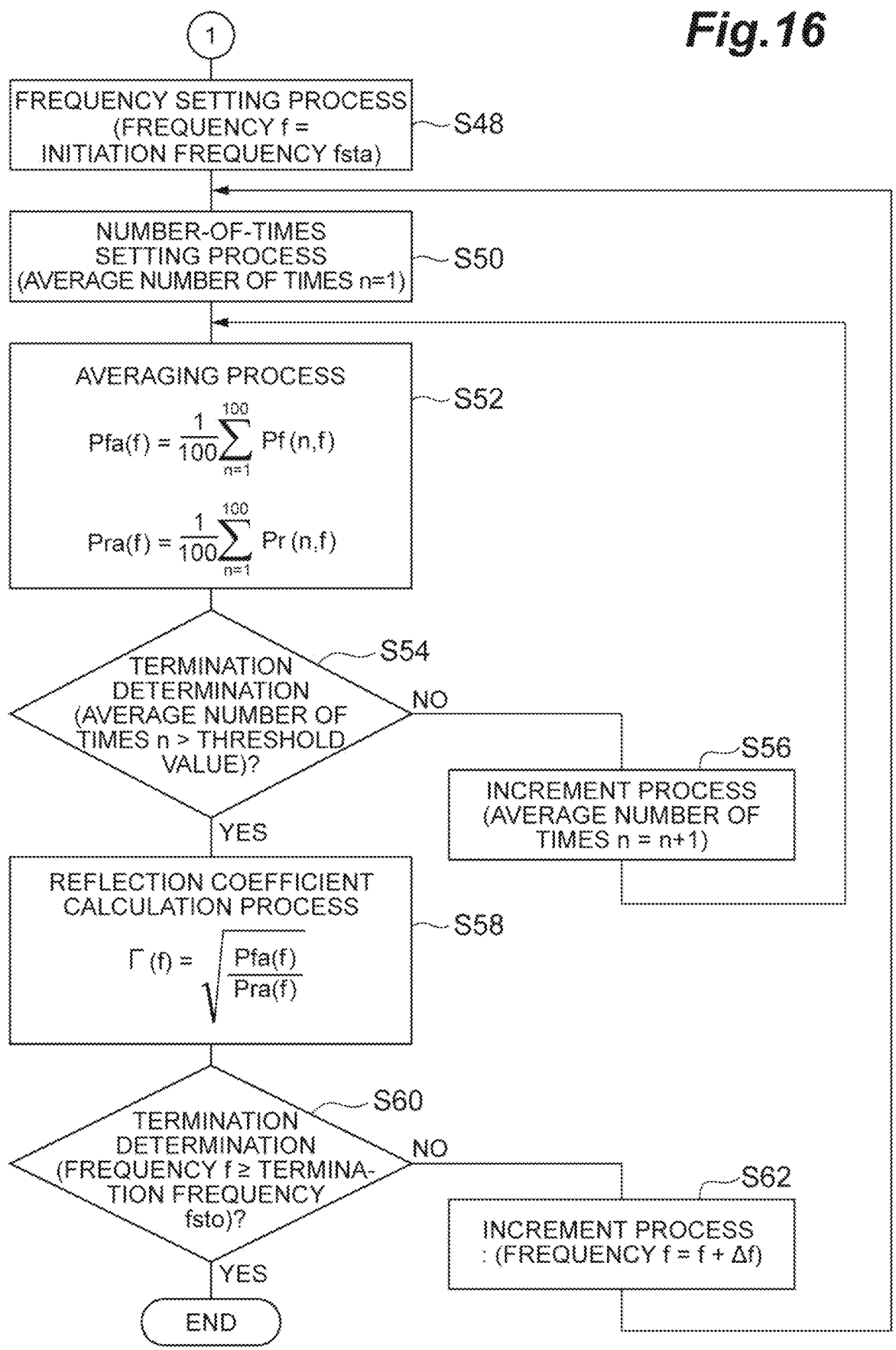
FIG. 16 is a flowchart illustrating an example of the reflection coefficient calculation process.

FIG. 15 and FIG. 16 are flowcharts of a reflection coefficient calculation process. The flowchart illustrated in FIG. 15 is executed by the controller 100, and the process is initiated, for example, in response to an initiation operation by an apparatus manager.

As illustrated in FIG. 15, as a setting process (S30), the controller 100 sets a modulation mode, a frequency range, power, and a sweep rate. For example, the controller 100 outputs a modulation mode, a frequency range, and a sweep rate, which are set in advance by an apparatus manager and the like, to the waveform generation unit 161. The controller 100 outputs predetermined power to the power control unit 162.

As a modulation initiation process (S32), the controller 100 outputs a signal, which indicates initiation of modulation, to respective constituent elements. Next, as number-of-times setting process (S34), the controller 100 sets an average number of times n to 1. In addition, as a frequency setting process (S36), the controller 100 sets a frequency f to an initiation frequency fsta. In addition, as a power acquisition process (S37), the controller 100 operates the respective constituent elements and acquires travelling wave power Pf(f) and reflected wave power Pr(f). Continuously, as a correction process (S38), the controller 100 integrates a correction coefficient to each of the travelling wave power Pf(f) and the reflected wave power Pr(f) which are acquired in the power acquisition process (S37). In addition, the controller 100 determines whether or not a current frequency f is equal to or greater than the termination frequency fsto as a termination determination (S40). In a case where the current frequency f is not equal to or greater than the termination frequency fsto, that is, in a case where the current frequency f is in a setting frequency range, as an increment process (S42), the controller 100 adds a predetermined frequency Δf to the current frequency f. For example, 0.1 MHz can be used as Δf. Then, the controller 100 executes the power acquisition process (S37), the correction process (S38), and the termination determination (S40). As described above, the controller 100 repetitively executes the increment process (S42), the power acquisition process (S37), and the correction process (S38) until the current frequency exceeds the termination frequency fsto. That is, the controller 100 measures power of an interval Δf in the setting frequency range.

In the termination determination (S40), in a case where the current frequency f is equal to or greater than the termination frequency fsto, as a termination determination (S44), the controller 100 determines whether or not the current average number of times n is greater than a threshold value. The threshold value is a value that is set in advance, and for example, the number of times capable of removing a white noise is set as the threshold value. For example, as the threshold value, 128 times may be set. In a case where the current average number of times n is not greater than the threshold value, as an increment process (S46), the controller 100 increments the current average number of times n (increments once). Then, the controller 100 executes the frequency setting process (S36), the power acquisition process (S37), the correction process (S38), the termination determination (S40), and the termination determination (S44). As described above, the controller 100 repetitively executes the frequency setting process (S36), the power acquisition process (S37), the correction process (S38), and the termination determination (S40) until the average number of times n becomes the threshold value. That is, the controller 100 executes power measurement in the interval Δf in the setting frequency range in the number of times set by the threshold value.

In the termination determination (S44), in a case where the current average number of times n is greater than the threshold value, as a frequency setting process (S48), the controller 100 sets the frequency f to the initiation frequency fsta as illustrated in FIG. 16. This process is a pre-process for averaging data that is measured in number of times corresponding to the threshold value. Next, as number-of-times setting process (S50), the controller 100 sets the average number of times n to 1. This process is a pre-process for averaging data that is measured in number of times corresponding to the threshold value.

As an averaging process (S52), the controller 100 averages data that is measured in number of times corresponding to the threshold value. When the travelling wave power at the average number of times n and the frequency f is set as Pf(n, f), the travelling wave power that is averaged at the frequency f is set as Pfa(f), reflection power at the average number of times n and the frequency f is set as Pr(n, f), and the reflected wave power that is averaged at the frequency f is set as Pra(f), for example, the controller 100 performs averaging by using the following mathematical formula.

$$Pfa(f) = \frac{1}{100}\sum_{n=1}^{100} Pf(n, f)$$

$$Pra(f) = \frac{1}{100}\sum_{n=1}^{100} Pr(n, f)$$

Continuously, as termination determination (S54), the controller 100 determines whether or not the current average number of times n is greater than the threshold value. As the threshold value, the same threshold value as the threshold value used in the termination determination (S44) is used. In a case where the current average number of times n is not greater than the threshold value, as an increment process (S56), the controller 100 increments the current average number of times n (increments once). Then, the controller 100 executes the averaging process (S52) and the termination determination (S54). As described above, the controller 100 repetitively executes the averaging process (S52) until the average number of times n becomes the threshold value. That is, the controller 100 repeats the process by using the entirety of acquired data up to averaging.

In a case where the current average number of times n is greater than the threshold value in the termination determination (S54), it is assumed that averaging is performed by using the entirety of data of a predetermined frequency. According to this, as a reflection coefficient calculation process (S58), the controller 100 calculates reflection coefficient Γ(f) at a frequency f. For example, the controller 100 calculates the reflection coefficient Γ(f) by using the following mathematical formula.

$$\Gamma(f) = \sqrt{\frac{Pfa(f)}{Pra(f)}}$$

The controller 100 determines whether or not the current frequency f is equal to or greater than the termination frequency fsto as a termination determination (S60). In a case where the current frequency f is not equal to or greater than the termination frequency fsto, that is, the current frequency f is in a setting frequency range, as an increment process (S62), the controller 100 adds a predetermined frequency Δf to the current frequency f. For example, 0.1 MHz can be used as Δf. Then, the controller 100 executes the number-of-times setting process (S50), the averaging process (S52), the termination determination (S54), the increment process (S56), the reflection coefficient calculation process (S58), and the termination determination (S60). As described above, the controller 100 repetitively executes the number-of-times setting process (S50), the averaging process (S52), the termination determination (S54), the increment process (S56), and the reflection coefficient calculation process (S58) until the current frequency exceeds the termination frequency fsto. That is, the controller 100 averages power in an interval Δf in the setting frequency range for each frequency.

In the termination determination (S40), in a case where the current frequency f is equal to or greater than the termination frequency fsto, the controller 100 terminates the reflection coefficient acquisition process illustrated in FIGS. 15 and 16.

Function of Controller 100

The controller 100 calculates an absorption frequency that is a frequency at which the reflection coefficient Γ(f) becomes a minimum point. The controller 100 may determine whether or not maintenance is necessary or may change the power supply frequency of the microwave output device 16 on the basis of a variation of the absorption frequency.

Figure 17:
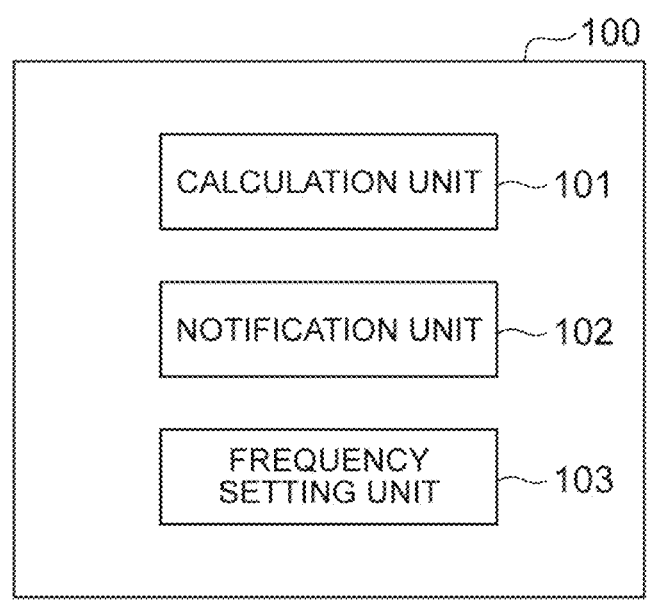
FIG. 17 is a functional block diagram of an exemplary controller.

FIG. 17 is a functional block diagram of the controller 100. As illustrated in FIG. 17, the controller 100 includes a calculation unit 101, a notification unit 102, and a frequency setting unit 103.

The calculation unit 101 calculates a frequency f at which the reflection coefficient Γ(f), which is calculated on the basis of the travelling wave power Pf(f) and the reflected wave power Pr(f), for each frequency f becomes a minimum point as the absorption frequency. Alternatively, the calculation unit 101 may calculate a frequency, at which the reflected wave power Pr(f) becomes a minimum point as the absorption frequency.

Figure 18:
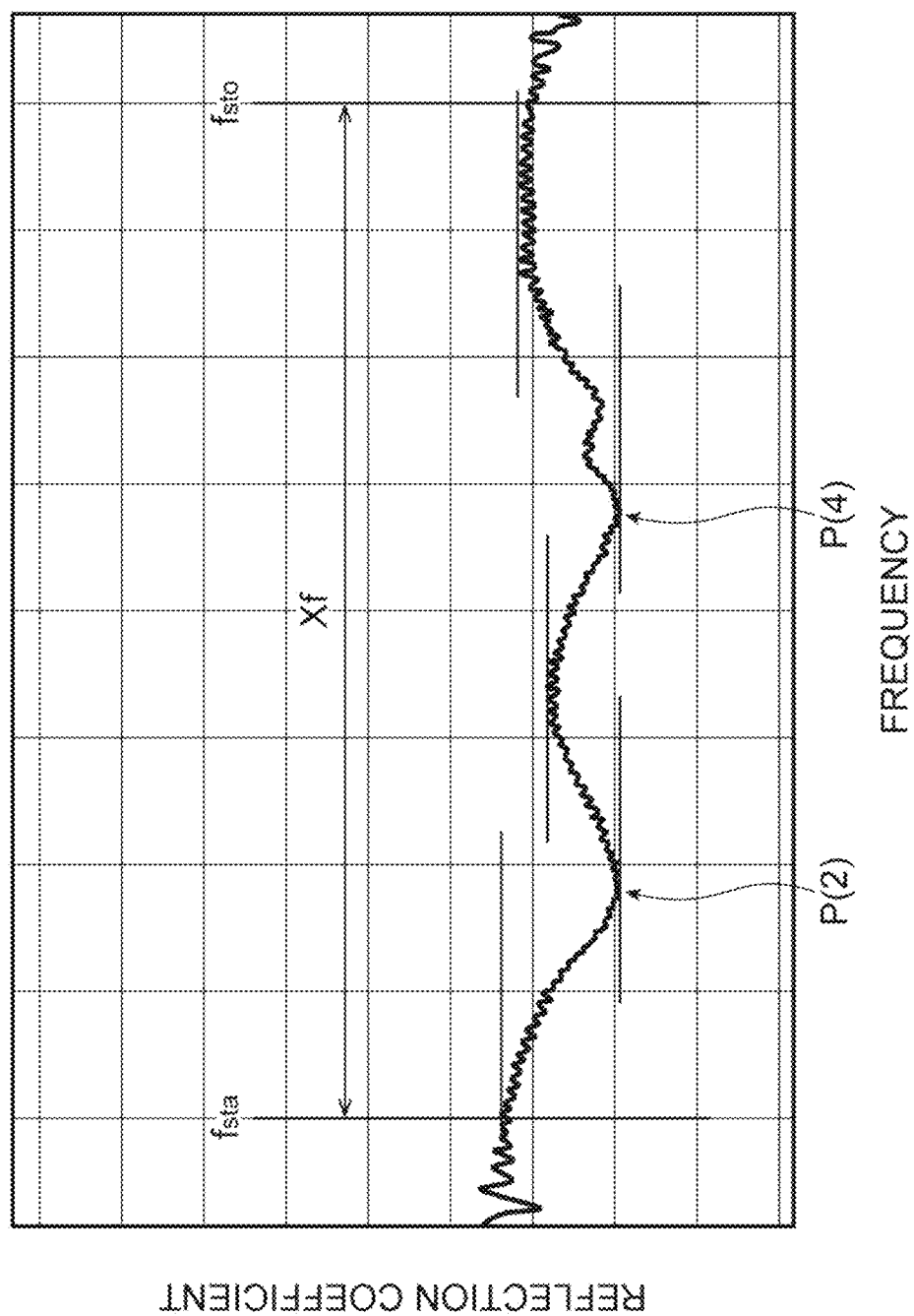
FIG. 18 is a view illustrating a minimum point of the reflection coefficient.

FIG. 18 is a view illustrating a minimum point of the reflection coefficient Γ(f). In the drawing, the vertical axis represents a reflection coefficient, and the horizontal axis represents a frequency. An effective range Xf of a frequency, at which the minimum value is obtained, is from an initiation frequency fsta and a termination frequency fsto. In the drawing, two minimum points indicated by P(2) and P(4) exist. A frequency that becomes a minimum point is an absorption frequency. A minimum point calculation process will be described later.

Returning to FIG. 17, the notification unit 102 outputs maintenance information corresponding to a difference between the absorption frequency and a reference absorption frequency that is acquired in advance. The reference absorption frequency is a threshold value that is used to evaluate the absorption frequency, and is an absorption frequency that is acquired in advance. In a plasma processing apparatus that uses a microwave, a ceiling plate and the like are consumed in correspondence with use, and thus the absorption frequency varies. That is, the smaller the difference between the absorption frequency and the reference absorption frequency acquired in advance is, the further a current apparatus state is close to an apparatus state at which the reference absorption frequency is acquired. In addition, the greater the difference between the absorption frequency and the reference absorption frequency acquired in advance is, the further the current apparatus state is different from the apparatus state at which the reference absorption frequency is acquired. The maintenance information includes information relating to the apparatus state, or information indicating whether or not maintenance is necessary. The information relating to the apparatus state is information indicating a normal state or an abnormal state of the apparatus. For example, the notification unit 102 outputs the maintenance information with a video, an image, a voice, and the like through a display, a speaker, and the like.

For example, the reference absorption frequency is acquired in advance at reference time such as at the time of shipment, after maintenance, and after cleaning. In this case, as the difference between the absorption frequency and the reference absorption frequency acquired in advance is smaller, the notification unit 102 can determine that the apparatus state is closer to the normal apparatus state at the time of shipment, after maintenance, or after cleaning. In addition, in a case where the difference between the absorption frequency and the reference absorption frequency acquired in advance is equal to or greater than a first threshold value, the notification unit 102 may determine that the current apparatus state is not the normal apparatus state, and may output maintenance information indicating necessity of maintenance. The first threshold value is a threshold value that is set in advance to determine the difference between the absorption frequency and the reference absorption frequency acquired in advance.

Furthermore, the reference absorption frequency may be acquired when the apparatus is abnormal. In this case, when the difference between the absorption frequency and the reference absorption frequency acquired in advance is equal to or less than a threshold value, the notification unit 102 may determine that the current apparatus state is not the normal apparatus state and may output maintenance information indicating that maintenance is necessary.

The frequency setting unit 103 changes a power supply frequency of the microwave output device 16 that is used in process processing in correspondence with a difference between the absorption frequency and the power supply frequency of the microwave output device 16. The microwave output device 16 is configured to variably adjust the power supply frequency. The frequency setting unit 103 outputs a signal to the microwave output device 16 to control the power supply frequency. The frequency setting unit 103 sets the power supply frequency during the process processing with reference to a recipe that is stored in the storage unit of the controller 100. For example, in a case where the difference between the absorption frequency and the power supply frequency is equal to or less than a second threshold value, the frequency setting unit 103 increases or decreases the power supply frequency by a predetermined frequency. The second threshold value is a threshold value that is set in advance to determine the difference between the absorption frequency and the power supply frequency. In a case where an absorption frequency of plasma is close to a power supply frequency of a microwave output unit, there is a concern that plasma may be unstable. The frequency setting unit 103 operates so as to avoid a situation in which the absorption frequency and the power supply frequency match each other, thereby preventing the plasma from being unstable.

Minimum Point Calculation Process: Reflection Coefficient

Figure 19:
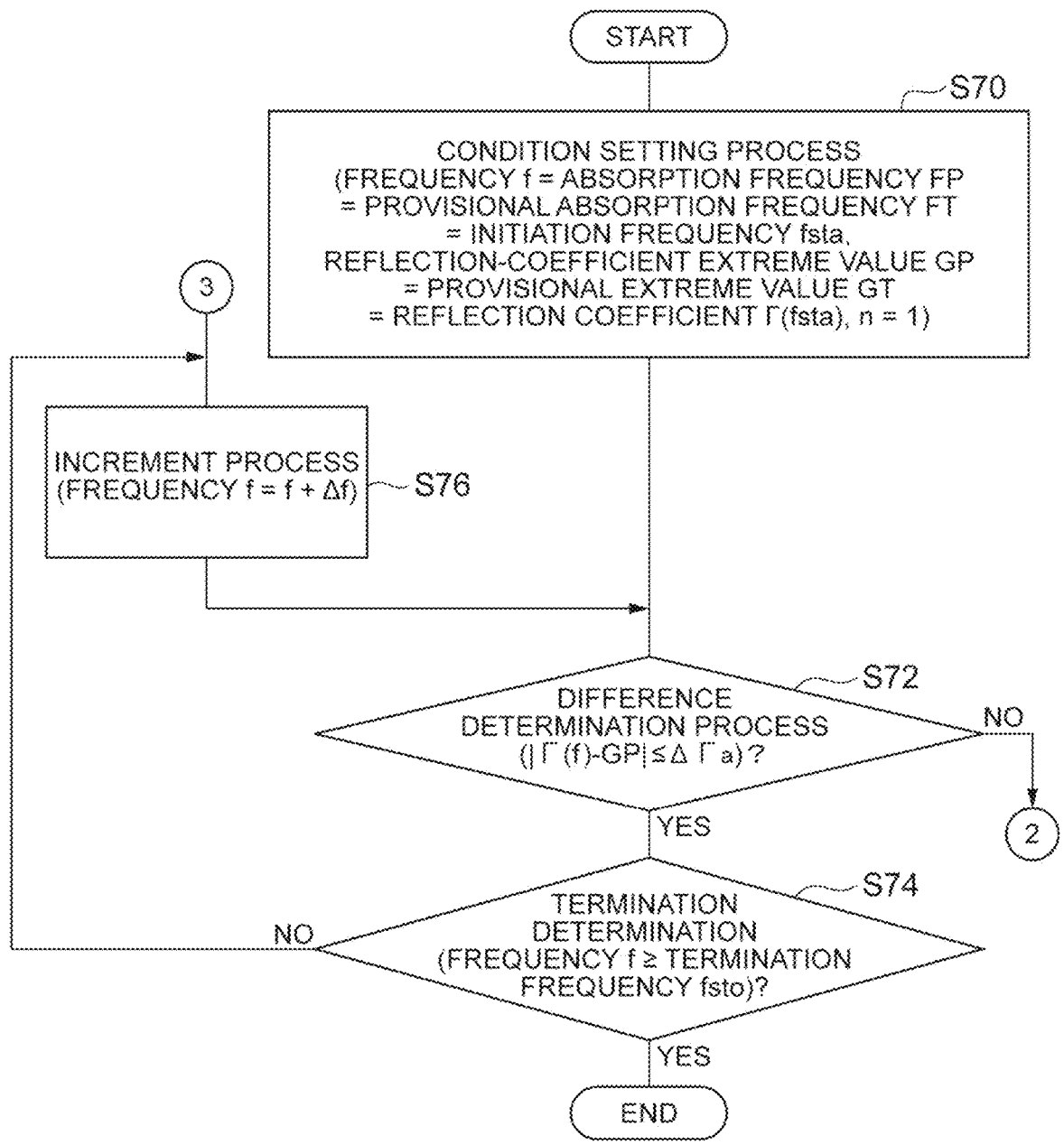
FIG. 19 is a flowchart illustrating an example of a reflection-coefficient extreme value calculation process.
Figure 20:
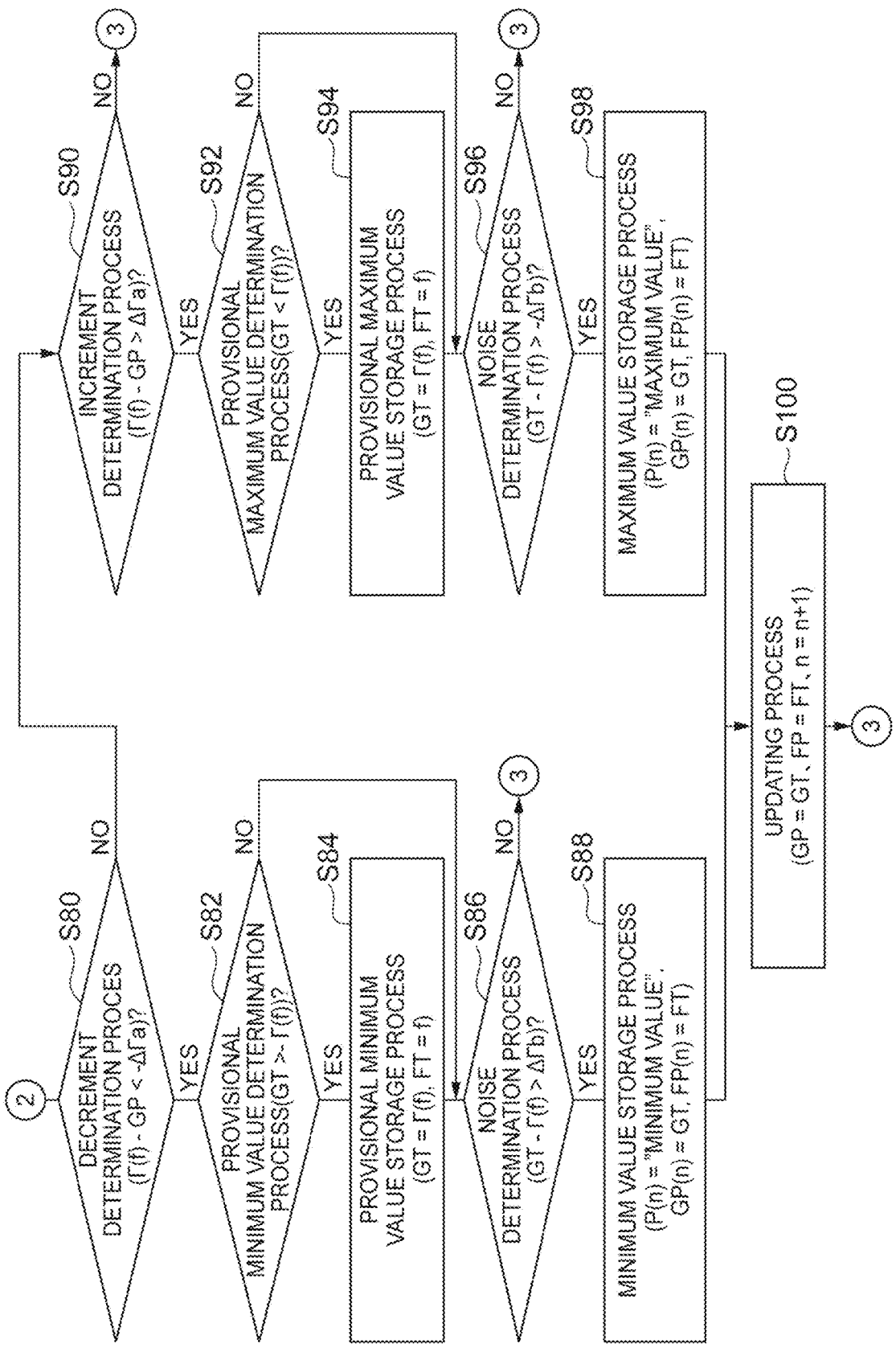
FIG. 20 is a flowchart illustrating an example of the reflection-coefficient extreme value calculation process.

FIG. 19 and FIG. 20 are flowcharts of a reflection-coefficient extreme value calculation process. The flowcharts illustrated in FIG. 19 and FIG. 20 are executed by the calculation unit 101 of the controller 100, and the process is initiated, for example, in response to an initiation operation by an apparatus manager.

First, as a condition setting process (S70), the calculation unit 101 sets an initial value. The calculation unit 101 sets a frequency f, an absorption frequency FP, and a provisional absorption frequency FT as an initiation frequency fsta. In addition, the calculation unit 101 sets a reflection-coefficient extreme value GP and a provisional extreme value GT as a reflection coefficient Γ(fsta) of the initiation frequency fsta. In addition, the calculation unit 101 sets n to 1.

Next, as a difference determination process (S72), the calculation unit 101 determines whether or not an absolute value of a difference between the reflection coefficient Γ(f) at a current frequency f and the reflection-coefficient extreme value GP is equal to or less than the threshold value ΔΓa. The determination in terms of a mathematical formula is as follows.

$|Γ(f)-GP|≤ΔΓa$

The threshold value ΔΓa is a predetermined threshold value for determination of an extreme value, and 0.05 may be used as an example.

In the difference determination process (S72), in a case where the absolute value of the difference between the reflection coefficient Γ(f) at the current frequency f and the reflection-coefficient extreme value GP is equal to or less than the threshold value ΔΓa, as a termination determination process (S74), the calculation unit 101 determines whether or not the current frequency f is equal to or greater than the termination frequency fsto. In a case where the current frequency f is not equal to or greater than the termination frequency fsto, that is, in a case where the current frequency f is in a setting frequency range, as an increment process (S76), the calculation unit 101 adds a predetermined frequency Δf to the current frequency f. For example, 0.1 MHz can be used as Δf. After execution of the increment process (S76), the calculation unit 101 executes the difference determination process (S72) again. As described above, the calculation unit 101 repetitively executes the increment process (S76) and the difference determination process (S72) until satisfying the termination determination (S74).

On the other hand, in the difference determination process (S72), in a case where the absolute value of the difference between the reflection coefficient Γ(f) at the current frequency f and the reflection-coefficient extreme value GP is not equal to or less than the threshold value ΔΓa, the calculation unit 101 transitions to a decrement determination process (S80) in FIG. 20.

As the decrement determination process (S80), the calculation unit 101 determines whether or not the difference between the reflection coefficient Γ(f) at the current frequency f and the reflection-coefficient extreme value GP is less than a threshold value –ΔΓa. The determination in terms of a mathematical formula is as follows.

$Γ(f)-GP<-ΔΓa$

In the decrement determination process (S80), in a case where the difference between the reflection coefficient Γ(f) at the current frequency f and the reflection-coefficient extreme value GP is less than the threshold value –ΔΓa, the calculation unit 101 transitions to a provisional minimum value determination process (S82).

As the provisional minimum value determination process (S82), the calculation unit 101 determines whether or not the reflection coefficient Γ(f) of the current frequency f is less than the reflection-coefficient provisional extreme value GT. The determination in terms of a mathematical formula is as follows.

$GT>Γ(f)$

In the provisional minimum value determination process (S82), in a case where the reflection coefficient Γ(f) of the current frequency f is less than reflection-coefficient provisional extreme value GT, the calculation unit 101 transitions to a provisional minimum value storage process (S84). As the provisional minimum value storage process (S84), the calculation unit 101 sets the reflection-coefficient provisional extreme value GT to the reflection coefficient Γ(f) at the current frequency f, and sets the absorption frequency FT to the current frequency f.

In a case where the reflection coefficient Γ(f) of the current frequency f is not less than the reflection-coefficient provisional extreme value GT in the provisional minimum value determination process (S82), or in a case where the provisional minimum value storage process (S84) is terminated, as a noise determination process (S86), the calculation unit 101 determines whether or not a difference between the reflection-coefficient provisional extreme value GT and the reflection coefficient Γ(f) of the current frequency f is greater than a threshold value ΔΓb. The determination in terms of a mathematical formula is as follows.

$$GT-\Gamma(f) > \Delta\Gamma b$$

The threshold value ΔΓb is a predetermined threshold value for determination on whether or not the difference is in a noise level, and 0.02 can be used as an example.

In the noise determination process (S86), in a case where the difference between the reflection-coefficient provisional extreme value GT and the reflection coefficient Γ(f) of the current frequency f is greater than the threshold value ΔΓb, the calculation unit 101 transitions to a minimum value storage process (S88). As the minimum value storage process (S88), the calculation unit 101 sets P(n) to "minimum value", sets the provisional extreme value GT to an extreme value GP(n), and sets the absorption frequency FT to an absorption frequency FP(n).

Continuously, as an updating process (S100), the calculation unit 101 sets the provisional extreme value GT to the extreme value GP, sets the absorption frequency FT to the absorption frequency FP, and sets n+1 to n. Then, the calculation unit 101 executes the increment process (S76) described in FIG. 19. Description of processes subsequent to the increment process (S76) is the same as described above.

Similarly, in the noise determination process (S86), in a case where the difference between the reflection-coefficient provisional extreme value GT and the reflection coefficient Γ(f) of the current frequency f is not greater than the threshold value ΔΓb, the calculation unit 101 executes the increment process (S76) described in FIG. 19. Description of processes subsequent to the increment process (S76) is the same as described above.

In addition, in the increment determination process (S90), in a case where the difference between the reflection coefficient Γ(f) at the current frequency f and the reflection-coefficient extreme value GP is greater than the threshold value ΔΓa, the calculation unit 101 transitions to a provisional maximum value determination process (S92).

As the provisional maximum value determination process (S92), the calculation unit 101 determines whether or not the reflection coefficient Γ(f) of the current frequency f is greater than the reflection-coefficient provisional extreme value GT. The determination in terms of a mathematical formula is as follows.

$$GT < \Gamma(f)$$

In the provisional maximum value determination process (S92), in a case where the reflection coefficient Γ(f) of the current frequency f is greater than the reflection-coefficient provisional extreme value GT, the calculation unit 101 transitions to a provisional maximum value storage process (S94). As the provisional maximum value storage process (S94), the calculation unit 101 sets the reflection-coefficient provisional extreme value GT to the reflection coefficient Γ(f) of the current frequency f, and sets the absorption frequency FT to the current frequency f.

In a case where the reflection coefficient Γ(f) of the current frequency f is not greater than the reflection-coefficient provisional extreme value GT in the provisional maximum value determination process (S92), or in a case where the provisional maximum value storage process (S94) is terminated, as a noise determination process (S96), the calculation unit 101 determines whether or not a difference between the reflection-coefficient provisional extreme value GT and the reflection coefficient Γ(f) of the current frequency f is greater than a threshold value −ΔΓb. The determination in terms of a mathematical formula is as follows.

$$GT - \Gamma(f) > -\Delta\Gamma b$$

The threshold value −ΔΓb is a predetermined threshold value for determination on whether or not the difference is in a noise level, and −0.02 can be used as an example.

In the noise determination process (S96), in a case where the difference between the reflection-coefficient provisional extreme value GT and the reflection coefficient Γ(f) of the current frequency f is greater than the threshold value −ΔΓb, the calculation unit 101 transitions to a maximum value storage process (S98). As the maximum value storage process (S98), the calculation unit 101 sets P(n) to "maximum value", sets the provisional extreme value GT to the extreme value GP(n), and sets the absorption frequency FT to the absorption frequency FP(n).

Continuously, as the updating process (S100), the calculation unit 101 sets the provisional extreme value GT to the extreme value GP, sets the absorption frequency FT to the absorption frequency FP, and sets n+1 to n. Then, the calculation unit 101 executes the increment process (S76) described in FIG. 19. Description of processes subsequent to the increment process (S76) is the same as described above.

Similarly, in the increment determination process (S90), in a case where the difference between the reflection coefficient Γ(f) at the current frequency f and the reflection-coefficient extreme value GP is not greater than the threshold value ΔΓa, the calculation unit 101 executes the increment process (S76) described in FIG. 19. Description of processes subsequent to the increment process (S76) is the same as described above.

Similarly, in the noise determination process (S96), in a case where the difference between the reflection-coefficient provisional extreme value GT and the reflection coefficient Γ(f) of the current frequency f is not greater than the threshold value −ΔΓb, the calculation unit 101 executes the increment process (S76) described in FIG. 19. Description of processes subsequent to the increment process (S76) is the same as described above.

In the termination determination (S74) described in FIG. 19, in a case where the current frequency f is equal to or greater than the termination frequency fsto, the calculation unit 101 terminates the extreme value acquisition process illustrated in FIG. 19 and FIG. 20.

As described above, the maximum value and the minimum value of the reflection coefficient are acquired by the extreme value acquisition process illustrated in FIG. 19 and FIG. 20.

Minimum Point Calculation Process: Reflected Wave Power

Figure 21:
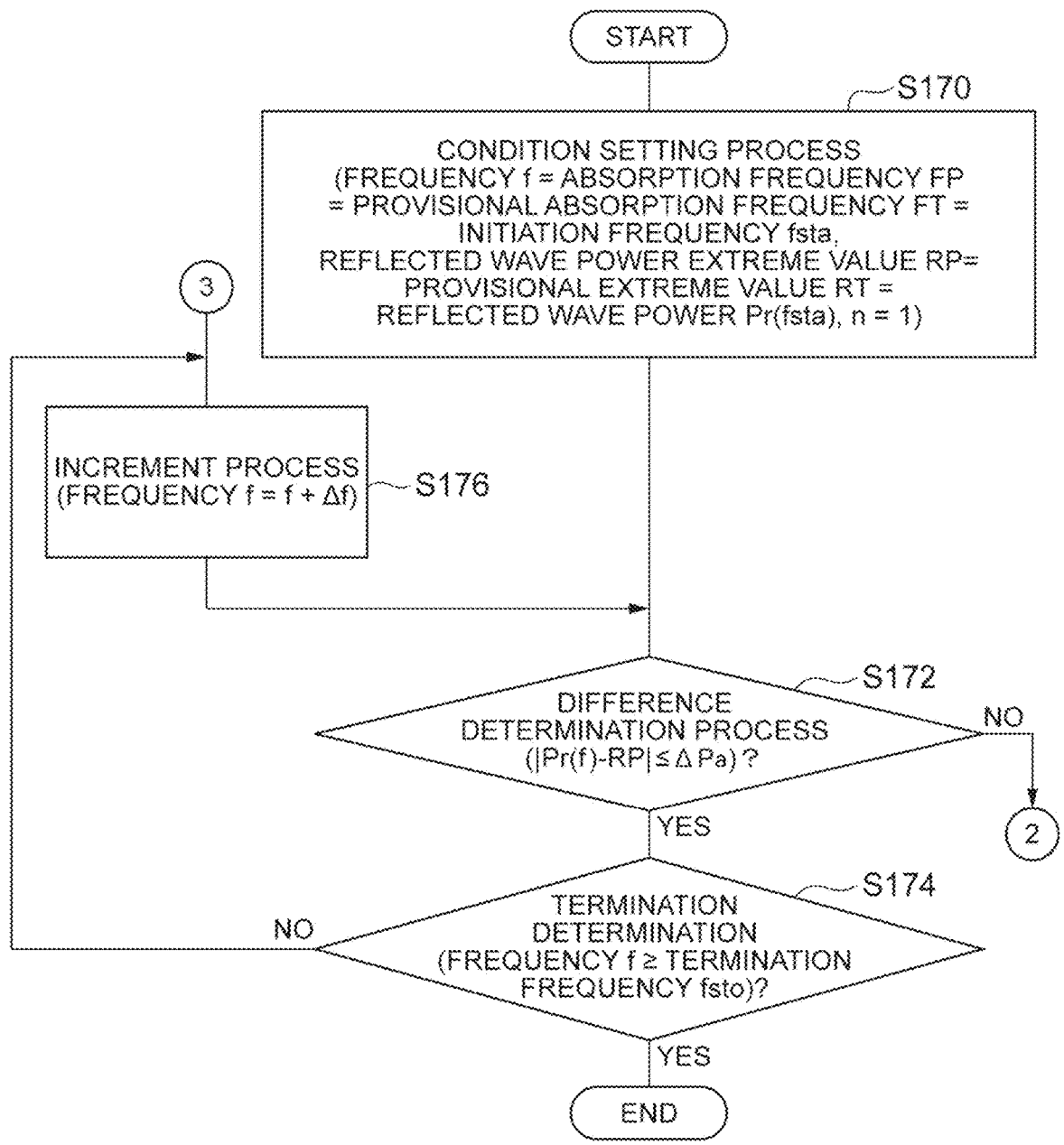
FIG. 21 is a flowchart illustrating an example of a reflected-wave-power extreme value calculation process.
Figure 22:
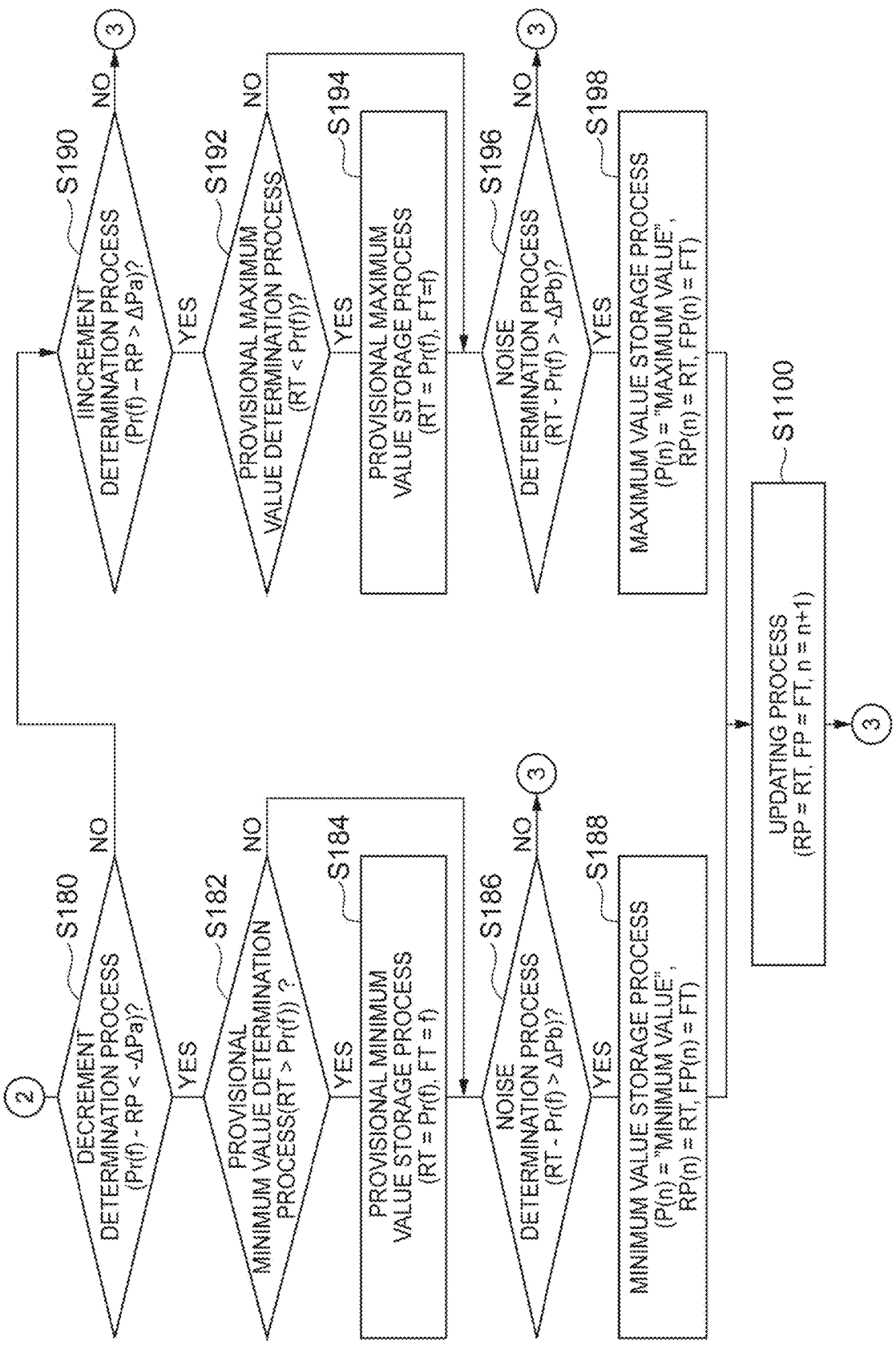
FIG. 22 is a flowchart illustrating an example of the reflected-wave-power extreme value calculation process.

FIG. 21 and FIG. 22 are flowcharts of a reflected-wave-power extreme value calculation process. The flowcharts illustrated in FIG. 21 and FIG. 22 are executed by the calculation unit 101 of the controller 100, and the process is initiated, for example, in response to an initiation operation of an apparatus manager.

First, as a condition setting process (S170), the calculation unit 101 sets an initial value. The calculation unit 101 sets a frequency f, an absorption frequency FP, and a provisional absorption frequency FT as an initiation frequency fsta. In addition, the calculation unit 101 sets a reflected-wave-power extreme value RP and a provisional extreme value RT as a reflected wave power Pr(fsta) of the initiation frequency fsta. In addition, the calculation unit 101 sets 1 to n.

Next, as a difference determination process (S172), the calculation unit 101 determines whether or not an absolute value of a difference between reflected wave power Pr(f) at a current frequency f and the reflected-wave-power extreme value RP is equal to or less than threshold value ΔPa. The determination in terms of a mathematical formula is as follows.

$$|Pr(f)-RP| \le \Delta Pa$$

The threshold value ΔPa is a predetermined threshold value for determination of an extreme value, and 5 dB can be used as an example.

In the difference determination process (S172), in a case where the absolute value of the difference between the reflected wave power Pr(f) at the current frequency f and the reflected-wave-power extreme value RP is equal to or less than the threshold value ΔPa, as a termination determination process (S174), the calculation unit 101 determines whether or not the current frequency f is equal to or greater than the termination frequency fsto. In a case where the current frequency f is not equal to or greater than the termination frequency fsto, that is, the current frequency f is in a setting frequency range, as an increment process (S176), the calculation unit 101 adds a predetermined frequency Δf to the current frequency f. For example, 0.1 MHz can be used as Δf. After execution of the increment process (S176), the calculation unit 101 executes the difference determination process (S172) again. As described above, the calculation unit 101 repetitively executes the increment process (S176) and the difference determination process (S172) until satisfying the termination determination (S174).

On the other hand, in the difference determination process (S172), in a case where the absolute value of the difference between the reflected wave power Pr(f) at the current frequency f and the reflected-wave-power extreme value RP is not equal to or less than the threshold value ΔPa, the calculation unit 101 transitions to a decrement determination process (S180) in FIG. 22.

As the decrement determination process (S180), the calculation unit 101 determines whether or not the difference between the reflected wave power Pr(f) at the current frequency f and the reflected-wave-power extreme value RP is less than a threshold value −ΔPa. The determination in terms of a mathematical formula is as follows.

$$Pr(f)-RP<-\Delta Pa$$

In the decrement determination process (S180), in a case where the difference between the reflected wave power Pr(f) at the current frequency f and the reflected-wave-power extreme value RP is less than the threshold value −ΔPa, the calculation unit 101 transitions to a provisional minimum value determination process (S182).

As the provisional minimum value determination process (S182), the calculation unit 101 determines whether or not the reflected wave power Pr(f) of the current frequency f is less than a reflected-wave-power provisional extreme value RT. The determination in terms of a mathematical formula is as follows.

$$RT>Pr(f)$$

In the provisional minimum value determination process (S182), in a case where the reflected wave power Pr(f) of the current frequency f is less than the reflected-wave-power provisional extreme value RT, the calculation unit 101 transitions to a provisional minimum value storage process (S184). As the provisional minimum value storage process (S184), the calculation unit 101 sets the reflected-wave-power provisional extreme value RT to the reflected wave power Pr(f) of the current frequency f, and sets the absorption frequency FT to the current frequency f.

In a case where the reflected wave power Pr(f) of the current frequency f is not less than the reflected-wave-power provisional extreme value RT in the provisional minimum value determination process (S182), or in a case where the provisional minimum value storage process (S184) is terminated, as a noise determination process (S186), the calculation unit 101 determines whether or not the difference between the reflected-wave-power provisional extreme value RT and the reflected wave power Pr(f) of the current frequency f is greater than a threshold value ΔPb. The determination in terms of a mathematical formula is as follows.

$$RT-Pr(f)>\Delta Pb$$

The threshold value ΔPb is a predetermined threshold value for determination on whether or not the difference is in a noise level, and 2 dB can be used as an example.

In the noise determination process (S186), in a case where the difference between the reflected-wave-power provisional extreme value RT and the reflected wave power Pr(f) of the current frequency f is greater than the threshold value ΔPb, the calculation unit 101 transitions to a minimum value storage process (S188). As the minimum value storage process (S188), the calculation unit 101 sets P(n) to "minimum value", sets the provisional extreme value RT to the extreme value RP(n), and sets the absorption frequency FT to the absorption frequency FP(n).

Continuously, as an updating process (S1100), the calculation unit 101 sets the provisional extreme value RT to the extreme value RP, sets the absorption frequency FT to the absorption frequency FP, and sets n+1 to n. Then, the calculation unit 101 executes the increment process (S176) described in FIG. 21. Description of processes subsequent to the increment process (S176) is the same as described above.

Similarly, in the noise determination process (S186), in a case where the difference between the reflected-wave-power provisional extreme value RT and the reflected wave power Pr(f) of the current frequency f is not greater than the threshold value ΔPb, the calculation unit 101 executes the increment process (S176) described in FIG. 21. Description of processes subsequent to the increment process (S176) is the same as described above.

In addition, in the increment determination process (S190), in a case where the difference between the reflected wave power Pr(f) at the current frequency f and the reflected-wave-power extreme value RP is greater than the threshold value ΔPa, the calculation unit 101 transitions to a provisional maximum value determination process (S192).

As the provisional maximum value determination process (S192), the calculation unit 101 determines whether or not the reflected wave power Pr(f) of the current frequency f is greater than the reflected-wave-power provisional extreme value RT. The determination in terms of a mathematical formula is as follows.

$$RT<Pr(f)$$

In the provisional maximum value determination process (S192), in a case where the reflected wave power Pr(f) of the current frequency f is greater than the reflected-wave-power provisional extreme value RT, the calculation unit 101 transitions to a provisional maximum value storage process (S194). As the provisional maximum value storage process (S194), the calculation unit 101 sets the reflected-wave-power provisional extreme value RT to the reflected wave power Pr(f) of the current frequency f, and sets the absorption frequency FT to the current frequency f.

In a case where the reflected wave power Pr(f) of the current frequency f is not greater than the reflected-wave-power provisional extreme value RT in the provisional maximum value determination process (S192), or in a case where the provisional maximum value storage process (S194) is terminated, as a noise determination process (S196), the calculation unit 101 determines whether or not the difference between the reflected-wave-power provisional extreme value RT and the reflected wave power Pr(f) of the current frequency f is greater than a threshold value −ΔPb. The determination in terms of a mathematical formula is as follows.

$$RT-Pr(f)>-\Delta Pb$$

The threshold value −ΔPb is a predetermined threshold value for determination on whether or not the difference is in a noise level, and −2 dB can be used as an example.

In the noise determination process (S196), in a case where the difference between the reflected-wave-power provisional extreme value RT and the reflected wave power Pr(f) of the current frequency f is greater than the threshold value −ΔPb, the calculation unit 101 transitions to a maximum value storage process (S198). As the maximum value storage process (S198), the calculation unit 101 sets P(n) to "maximum value", sets the provisional extreme value RT to the extreme value RP(n), and sets the absorption frequency FT to the absorption frequency FP(n).

Continuously, as the updating process (S1100), the calculation unit 101 sets the provisional extreme value RT to the extreme value RP, sets the absorption frequency FT to the absorption frequency FP, and sets n+1 to n. Then, the calculation unit 101 executes the increment process (S176) described in FIG. 21. Description of processes subsequent to the increment process (S176) is the same as described above.

Similarly, in the increment determination process (S190), in a case where the difference between the reflected wave power Pr(f) at the current frequency f and the reflected-wave-power extreme value RP is not greater than the threshold value ΔPa, the calculation unit 101 executes the increment process (S176) described in FIG. 21. Description of processes subsequent to the increment process (S176) is the same as described above.

Similarly, in the noise determination process (S196), in a case where the difference between the reflected-wave-power provisional extreme value RT and the reflected wave power Pr(f) of the current frequency f is not greater than the threshold value −ΔPb, the calculation unit 101 executes the increment process (S176) described in FIG. 21. Description of processes subsequent to the increment process (S176) is the same as described above.

In the termination determination (S174) described in FIG. 21, in a case where the current frequency f is equal to or greater than the termination frequency fsto, the calculation unit 101 terminates the extreme value acquisition process illustrated in FIG. 21 and FIG. 22.

As described above, the maximum value and the minimum value of the reflected wave power are acquired by the extreme value acquisition process illustrated in FIG. 21 and FIG. 22.

Reference Absorption Frequency (Initial Absorption Frequency) Storage Process

Figure 23:
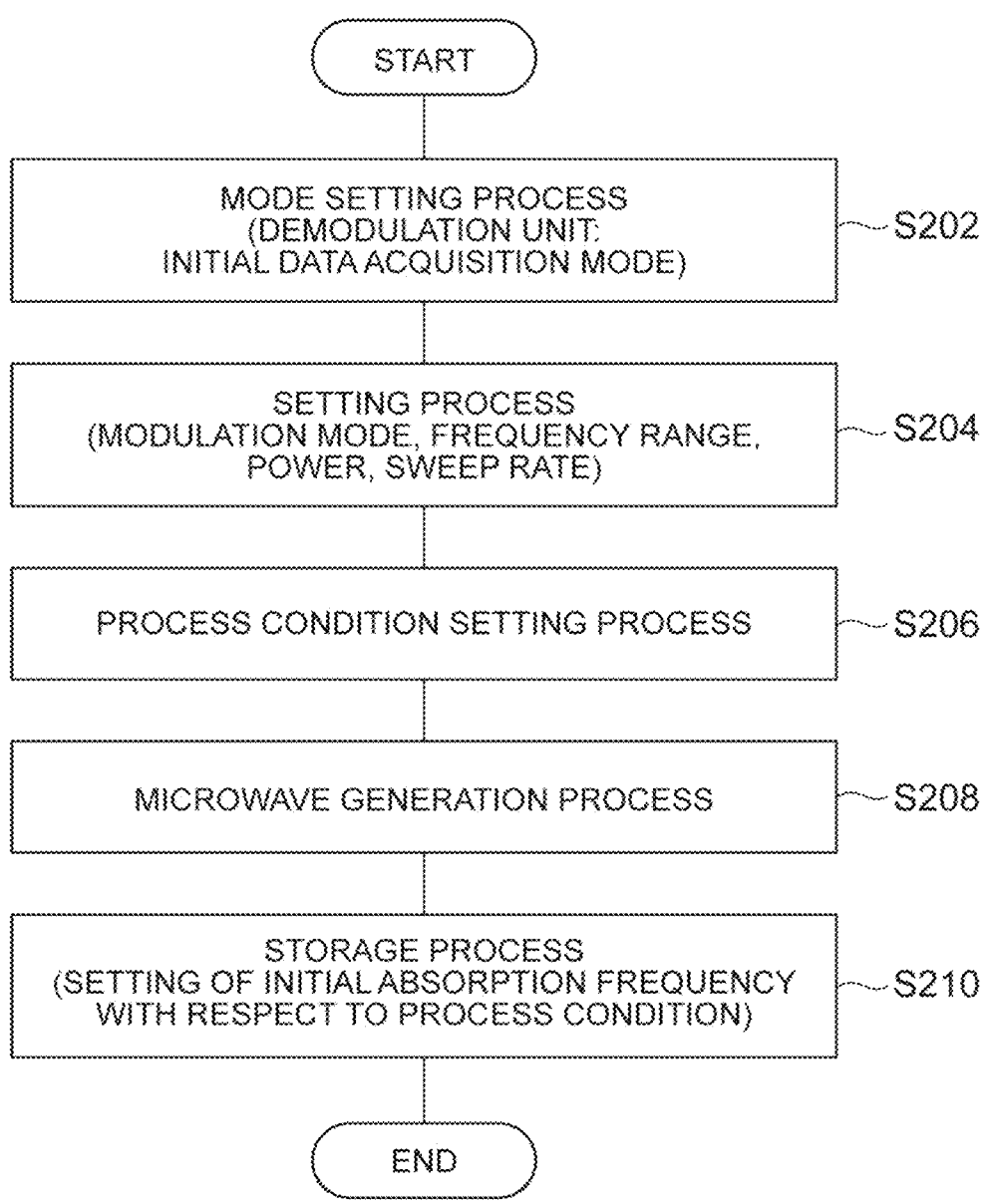
FIG. 23 is a flowchart illustrating an example of a reference absorption frequency (initial absorption frequency) storage process.

Next, description will be given of a process of storing an initial value of the absorption frequency. FIG. 23 is a flowchart of a reference absorption frequency (initial absorption frequency) storage process. The flowchart illustrated in FIG. 23 is executed by the controller 100, and the process is initiated, for example, in response to an initiation operation by an apparatus manager after execution of maintenance.

As a mode setting process (S202), the controller 100 sets an apparatus to an initial data storage mode. For example, the controller 100 performs the setting to realize a mode in which an initial data storage region is secured, an online state is established so that constituent elements of the apparatus can operate, and a demodulation unit acquires initial data.

Next, as a setting process (S204), the controller 100 sets a modulation mode, a frequency range, power, and a sweep rate. In addition, as a process condition setting process (S206), the controller 100 fetches process conditions stored in a storage unit in advance, and sets gas species, process time, and the like. Continuously, as a microwave generation process (S208), the controller 100 generates a microwave on the basis of the setting in the setting process (S204) and the process condition setting process (S206). In addition, as a storage process (S210), the controller 100 measures an absorption frequency and stores the absorption frequency. For example, the controller 100 stores the absorption frequency in the storage unit in correlation with the process conditions. The absorption frequency may be calculated in relation to any one of the reflection coefficient and the reflected wave power. When the storage process (S210) is terminated, the controller 100 terminates the flowchart illustrated in FIG. 23.

As described above, when the flowchart illustrated in FIG. 23 is executed, the absorption frequency is stored in the storage unit for each of the process conditions. The absorption frequency that is stored is a value that reflects an apparatus state immediately after maintenance, and thus the absorption frequency is used as the reference absorption frequency (initial absorption frequency).

Information Output Process

Figure 24:
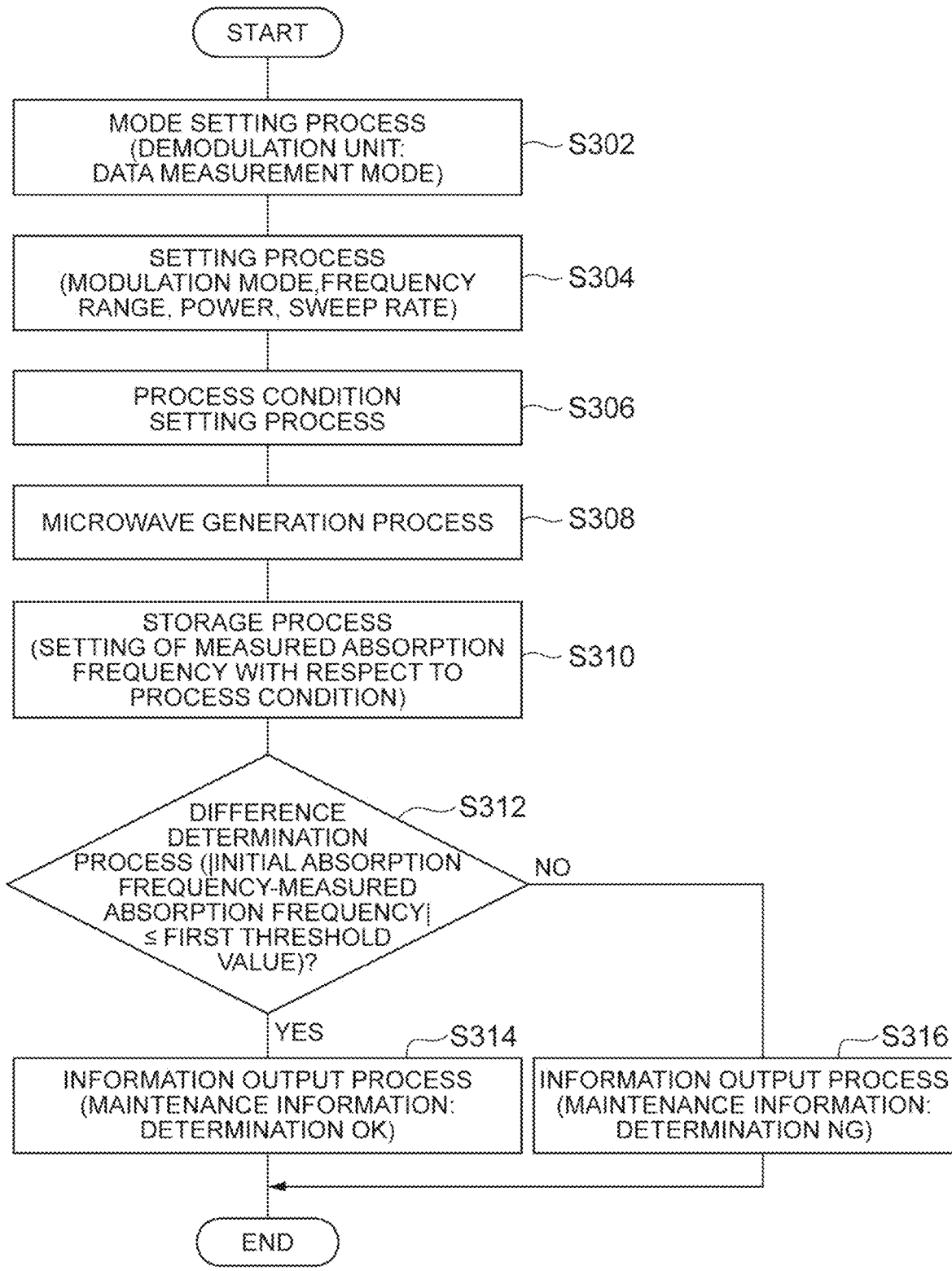
FIG. 24 is a flowchart illustrating an example of an information output process.

Next, an information output process will be described. FIG. 24 is a flowchart of the information output process. The flowchart illustrated in FIG. 24 is executed by the controller 100, and the process is initiated, for example, in response to an initiation operation of an apparatus manager.

As a mode setting process (S302), the controller 100 sets an apparatus to a data measurement mode. For example, the controller 100 performs the setting to realize a mode in which a measured data storage region is secured, an online state is established so that constituent elements of the apparatus can operate, and a demodulation unit acquires measurement data.

Next, as a setting process (S304), the controller 100 sets a modulation mode, a frequency range, power, and a sweep rate. In addition, as a process condition setting process (S306), the controller 100 fetches process conditions stored in a storage unit in advance, and sets gas species, process time, and the like. Continuously, as a microwave generation process (S308), the controller 100 generates a microwave on the basis of the setting in the setting process (S304) and the process condition setting process (S306). In addition, as a storage process (S310), the controller 100 measures an absorption frequency and stores the absorption frequency. For example, the controller 100 stores the absorption frequency in the storage unit in correlation with the process conditions.

Continuously, as a difference determination process (S312), the notification unit 102 of the controller 100 compares the initial absorption frequency and a measured absorption frequency. For example, the notification unit 102 determines whether or not an absolute value of a difference between the initial absorption frequency and the measured absorption frequency is equal to or less than a first threshold value. As the first threshold value, for example, 5 MHz and the like can be set.

In the difference determination process (S312), in a case where the absolute value of the difference between the initial absorption frequency and the measured absorption frequency is equal to or less than the first threshold value, as an information output process (S314), the notification unit 102 outputs maintenance information (determination OK) indicating that maintenance is not necessary. On the other hand, in the difference determination process (S312), in a case where the absolute value of the difference between the initial absorption frequency and the measured absorption frequency is not equal to or less than the first threshold value, as an information output process (S316), the notification unit 102 outputs maintenance information (determination NG) indicating that maintenance is necessary. When the information output process (S314 or S316) is terminated, the controller 100 terminates the flowchart illustrated in FIG. 24.

Process of Changing Power Supply Frequency of Microwave Output Device 16

Figure 25:
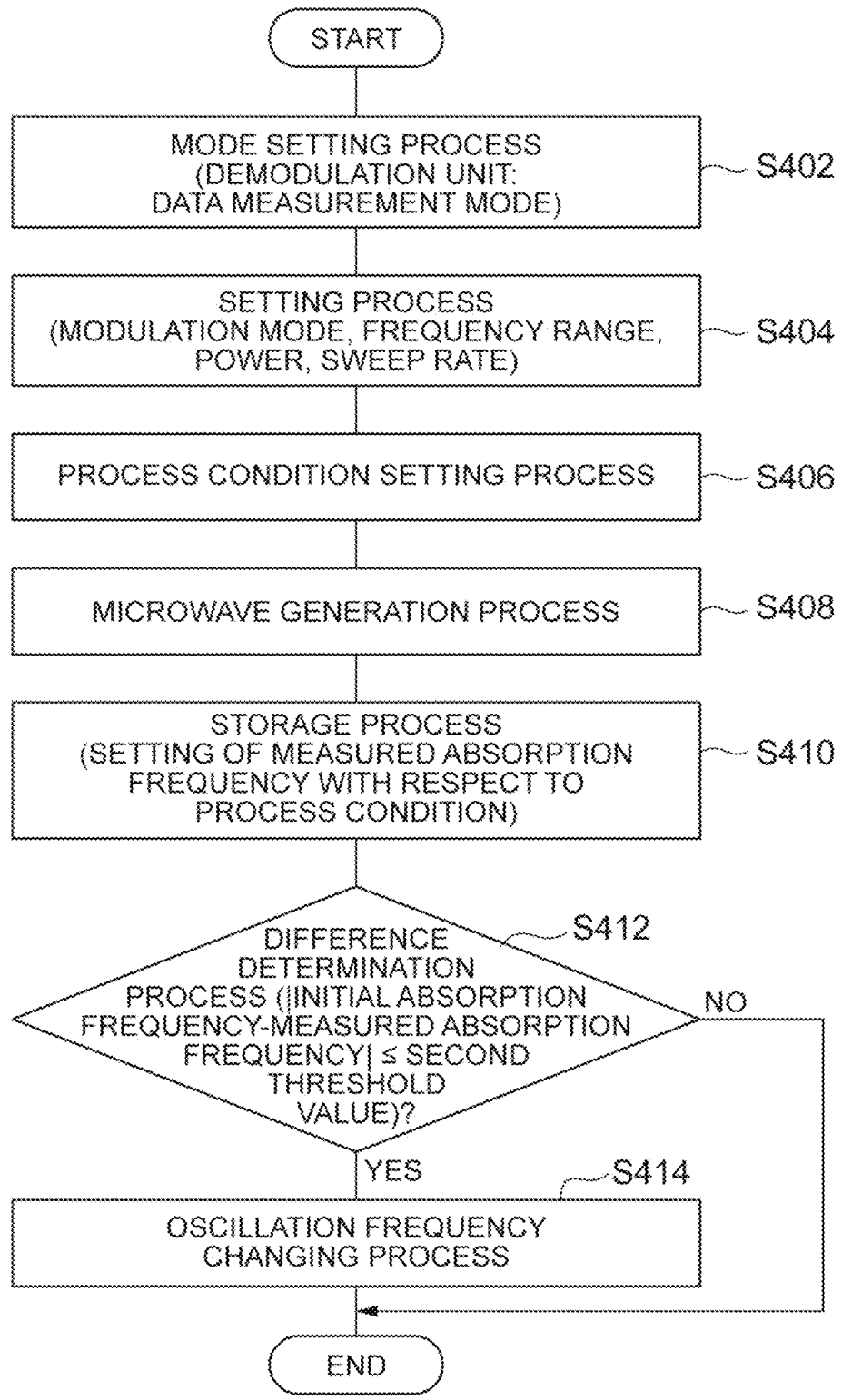
FIG. 25 is a flowchart illustrating an example of a power-supply frequency changing process related to the microwave output device.

Next, an information output process will be described. FIG. 25 is a flowchart illustrating a process of changing a power supply frequency of the microwave output device 16. The flowchart illustrated in FIG. 25 is executed by the controller 100, and the process is initiated, for example, in response to an initiation operation by an apparatus manager.

As a mode setting process (S402), the controller 100 sets an apparatus to a data measurement mode. For example, the controller 100 performs the setting to realize a mode in which a measured data storage region is secured, an online state is established so that constituent elements of the apparatus can operate, and a demodulation unit acquires measurement data.

Next, as a setting process (S404), the controller 100 sets a modulation mode, a frequency range, power, and a sweep rate. In addition, as a process condition setting process (S406), the controller 100 fetches process conditions stored in a storage unit in advance, and sets gas species, process time, and the like. Continuously, as a microwave generation process (S408), the controller 100 generates a microwave on the basis of the setting in the setting process (S404) and the process condition setting process (S406). In addition, as a storage process (S410), the controller 100 measures an absorption frequency and stores the absorption frequency. For example, the controller 100 stores the absorption frequency in the storage unit in correlation with the process conditions.

Continuously, as a difference determination process (S412), the frequency setting unit 103 of the controller 100 compares the initial absorption frequency and a measured absorption frequency. For example, the frequency setting unit 103 determines whether or not an absolute value of a difference between the initial absorption frequency and the measured absorption frequency is equal to or less than a second threshold value. As the second threshold value, for example, 5 MHz and the like can be set.

In the difference determination process (S412), in a case where the absolute value of the difference between the initial absorption frequency and the measured absorption frequency is equal to or less than the second threshold value, as an oscillation frequency changing process (S414), the frequency setting unit 103 changes the power supply frequency of the microwave output device 16. For example, the frequency setting unit 103 changes the power supply frequency of the microwave output device 16 by adding 10 MHz to a current power supply frequency or by subtracting 10 MHz from the current power supply frequency. When the oscillation frequency changing process (S414) is terminated, the controller 100 terminates the flowchart illustrated in FIG. 25.

As described above, in the plasma processing apparatus 1, the demodulation unit 29, which acquires the travelling wave power and the reflected wave power for each frequency, is provided between the tuner 26 and the antenna 18 in the wave guide tube 21. In addition, a frequency, at which the reflection coefficient for every frequency becomes a minimum point, is calculated as the absorption frequency by the calculation unit 101. As described above, in the apparatus, it is not necessary to dispose a probe in a plasma space, and thus it is possible to calculate the absorption frequency without applying disturbance to plasma.

In addition, in the plasma processing apparatus 1, the demodulation unit 29, which acquires the reflected wave power for every frequency, is provided between the tuner 26 and the antenna 18 in the wave guide tube 21. In addition, a frequency, at which the reflected wave power becomes a minimum point, is calculated as the absorption frequency by the calculation unit 101. As described above, in the apparatus, it is not necessary to dispose a probe in a plasma space, and thus it is possible to calculate the absorption frequency without applying disturbance to plasma.

In addition, the plasma processing apparatus 1 that uses a microwave, a ceiling plate and the like are consumed in correspondence with use, and thus the absorption frequency varies. According to this, a magnitude of a difference between a reference absorption frequency that is acquired in advance at reference time such as at the time of shipment, after maintenance, and after cleaning, and an absorption frequency that is calculated by the calculation unit represents the degree of consumption of constituent elements of the plasma processing apparatus from the reference time to the present time. In the plasma processing apparatus 1, maintenance information, which includes information indicating whether or not the apparatus is consumed from the reference time and the like, is output by the notification unit 102 in correspondence with the difference. Accordingly, the plasma processing apparatus can notify a user and the like of the maintenance information.

In addition, in the plasma processing apparatus 1, in a case where the absorption frequency of plasma is closer to the power supply frequency of the microwave output device 16, there is a concern that plasma may be unstable. This is a phenomenon that is known as a so-called mode jump. Specifically, the mode jump is a phenomenon in which when a parameter such as a frequency is continuously changed, a plasma state sharply shifts at an arbitrary parameter. The frequency setting unit of the plasma processing apparatus changes the power supply frequency of the microwave output device 16 in correspondence with the difference, and thus it is possible to avoid the mode jump. According to this, in the plasma processing apparatus 1, it is possible to prevent plasma from being unstable.

Hereinbefore, description has been given of various embodiments, but various modification aspects can be constituted without limitation to the above-described embodiments. For example, respective embodiments may be combined. For example, the notification unit 102 and the frequency setting unit 103 may be provided in correspondence with usage applications. For example, in a case where only a function of determining necessity of maintenance on the basis of a variation of the absorption frequency is necessary, the controller 100 may include the notification unit 102 and may not include the frequency setting unit 103. For example, in a case where only a function of changing the power supply frequency of the microwave output device 16 is necessary, the controller 100 may include the frequency setting unit 103 and may not include the notification unit 102.

EXAMPLES

Hereinafter, examples carried out by the present inventors will be described.

Frequency Dependency of Microwave Absorption Efficiency

Figure 26A:
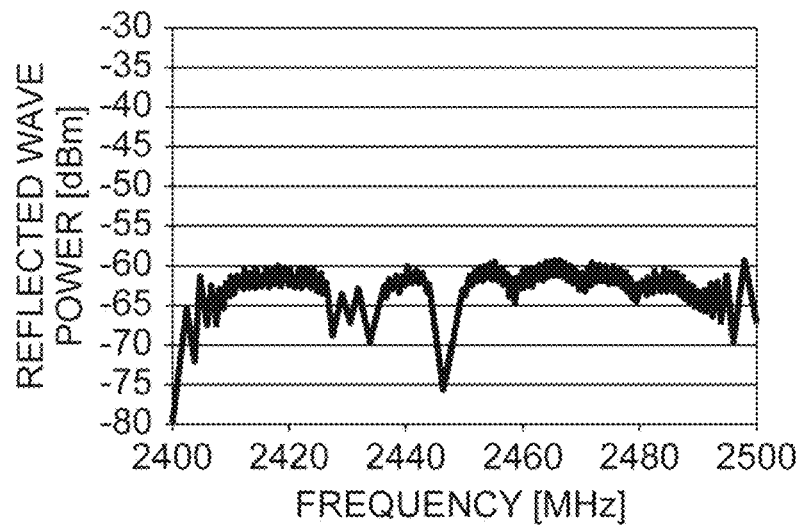
FIGS. 26A to 26C are views illustrating a measurement result of reflected wave power.
Figure 26B:
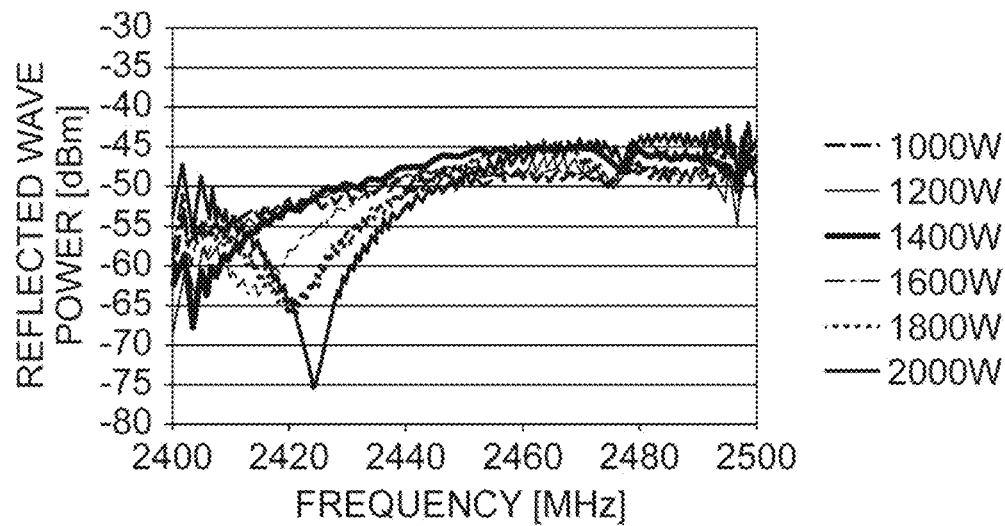
Figure 26C:
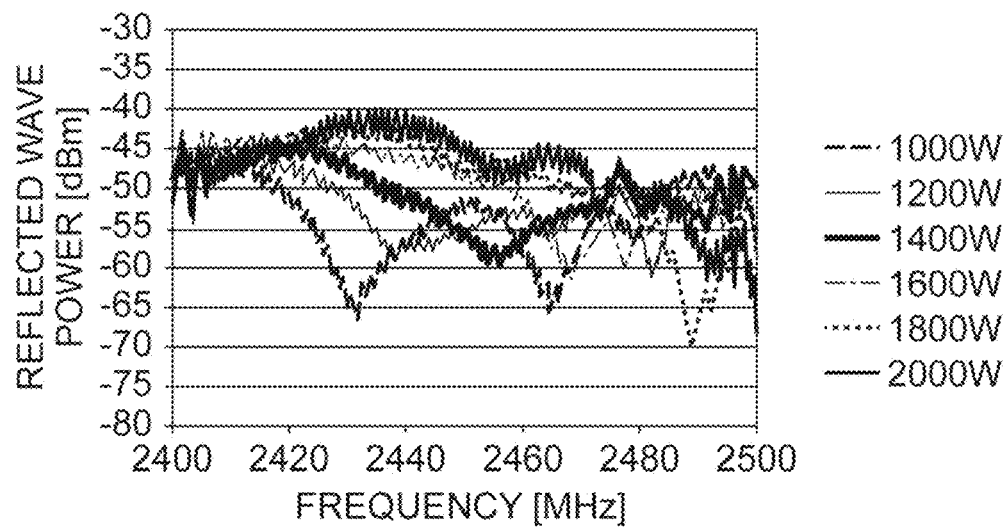

FIGS. 26A to 26C are views illustrating a measurement result of reflected wave power. In the drawings, the horizontal axis represents a frequency and the vertical axis represents the reflected wave power. FIG. 26A illustrates a measurement result of the reflected wave power in a state in which plasma is not generated. FIG. 26B illustrates a measurement result of the reflected wave power in a state in which plasma is generated by an Ar partial pressure of 20 mTorr (2.66 Pa). FIG. 26C illustrates a measurement result of the reflected wave power in a state in which plasma is generated by an Ar partial pressure of 100 mTorr (13.3 Pa). In FIGS. 26B and 26C, power is set in a range of 1000 W to 2000 W. As illustrated in FIGS. 26A to 26C, it was confirmed that frequency characteristics exist in FIGS. 26A to 26C, and the absorption frequency varies under apparatus conditions. That is, it was implied that an apparatus state can be grasped by using the absorption frequency.

Grasping of Plasma State by Frequency Sweep

Figure 27:
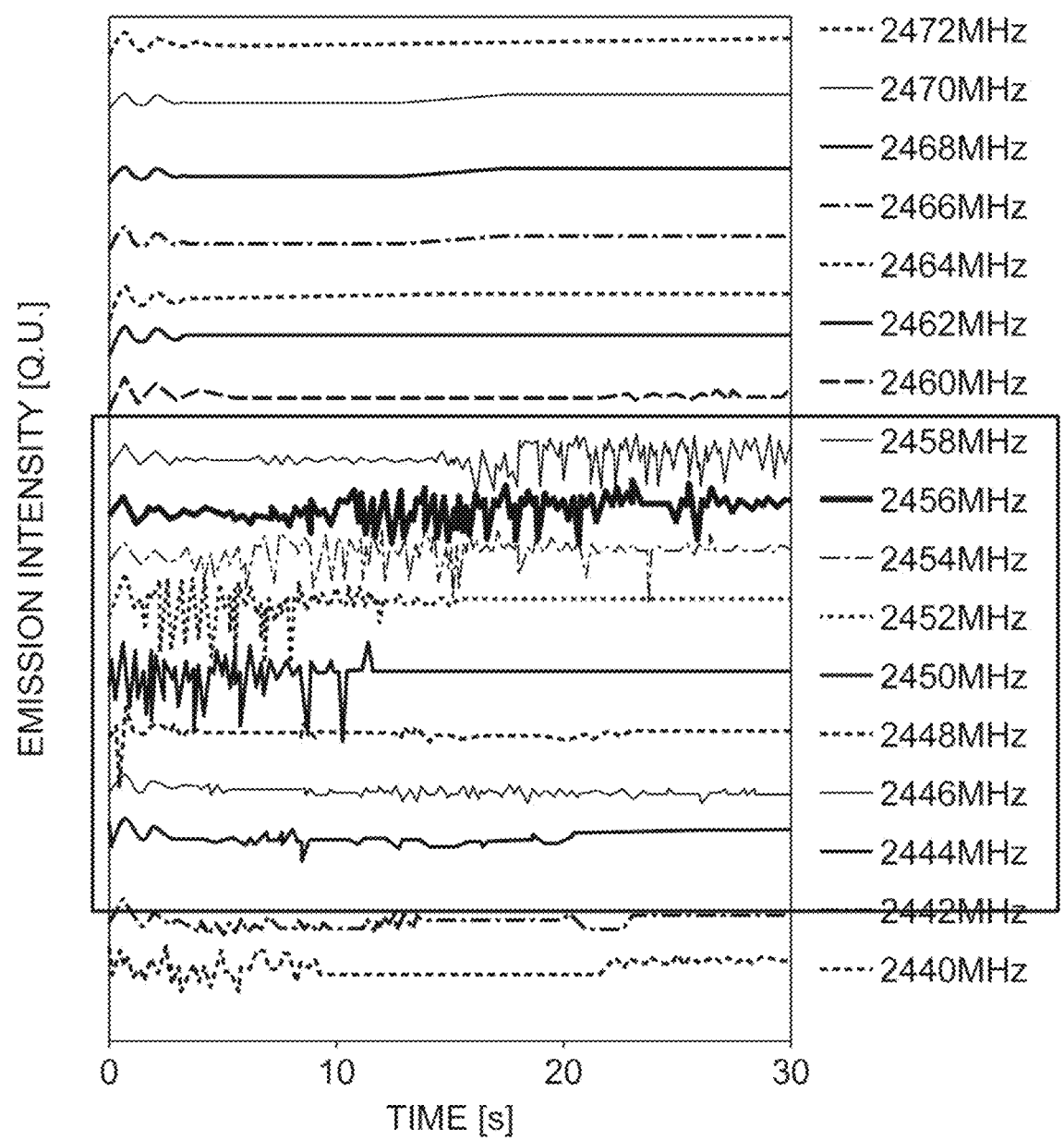
FIG. 27 is a view illustrating a measurement result of an emission intensity of plasma.

FIG. 27 illustrates a measurement result of an emission intensity of plasma. In the drawing, the horizontal axis represents time and the vertical axis represents emission intensity. The emission intensity is an intensity of plasma emission obtained by a light-receiving element and the like. Power of a power supply of the microwave output device 16 is 2400 W at each frequency, and the emission intensities at respective frequencies are approximately the same as each other. In FIG. 27, the emission intensity is written by dividing the emission intensity in a vertical direction for each frequency. As illustrated in FIG. 27, it was confirmed that flickering exists in a frequency of 2440 to 2458 MHz. As described above, it was confirmed that when being close to the power supply frequency of the microwave output device 16, plasma becomes unstable and when a difference from the power supply frequency of the microwave output device 16 is great, plasma becomes stable.

Plasma State Variation

Figure 28:
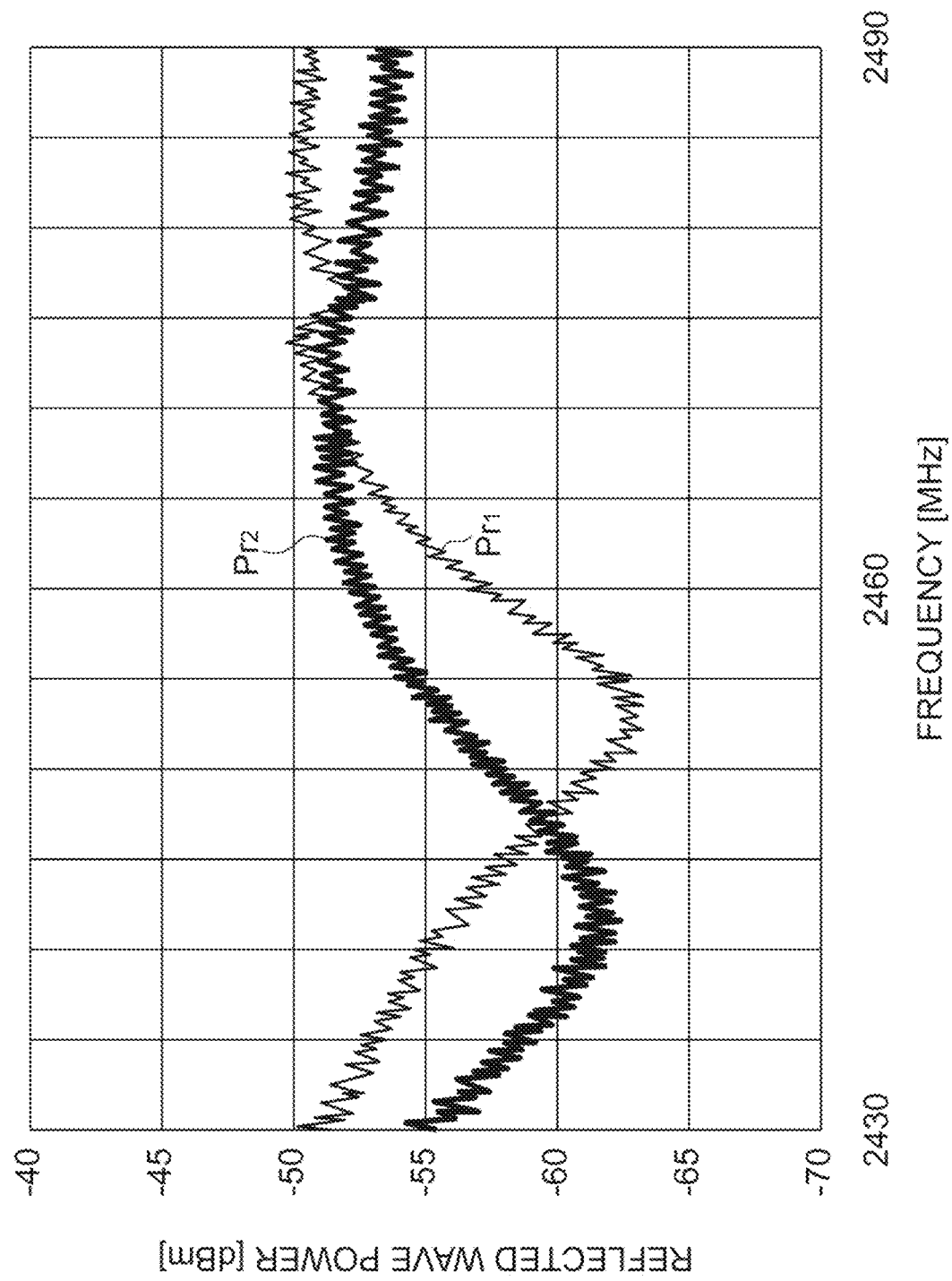
FIG. 28 is a view illustrating a measurement result of reflected wave power.

FIG. 28 illustrates a measurement result of the reflected wave power. In the drawing, the horizontal axis represents a frequency and the vertical axis represents the reflected wave power. Reflected wave power Pr1 is a measurement result when consumption articles (apparatus parts) are new products, and reflected wave power Pr2 is a measurement result when consumption articles are consumed. As illustrated in FIG. 28, it was confirmed that the minimum value of the reflected wave power is greatly different before and after consumption. That is, it was confirmed that the apparatus state can be grasped by using the minimum value of the reflected wave power.

What is claimed is:

1. A plasma processing apparatus, comprising:
   a microwave output unit configured to output a microwave having power corresponding to setting power while frequency-modulating the microwave in a setting frequency range;
   a wave guide tube configured to guide the microwave, which is output by the microwave output unit, to an antenna of a chamber main body;
   a tuner provided in the wave guide tube and configured to adjust a position of a movable plate so that impedance on the microwave output unit side and impedance on the antenna side match each other;
   a demodulation unit provided in the wave guide tube and including a first processer, the first processer programmed to acquire travelling wave power that is power of a travelling wave that travels on an inner side of the wave guide tube, and reflected wave power that is power of a reflected wave from the antenna side for each frequency, between the antenna and the tuner; and
   a controller including a second processor and a memory storing a reference absorption frequency associated with a process condition, the second processor programmed to:
   set a process condition;
   cause the microwave output unit to generate a microwave on the basis of the setting process condition;
   calculate a frequency at which a reflection coefficient, which is calculated on the basis of the travelling wave power and the reflected wave power, for each frequency becomes a minimum point as an absorption frequency; and
   when a difference between the reference absorption frequency stored in the memory corresponding to the set process condition and the calculated absorption frequency is equal to or less than a predetermined threshold value, increase or decrease a power supply frequency of the microwave output unit that is used in process processing so that the difference becomes larger than the predetermined threshold value,
   wherein the second processor is further programmed not to change the power supply frequency when the difference exceeds the predetermined threshold value, and
   wherein the predetermined threshold value is 5 Mhz.

2. A plasma processing apparatus, comprising:
   a microwave output unit configured to output a microwave having power corresponding to setting power while frequency-modulating the microwave in a setting frequency range;
   a wave guide tube configured to guide the microwave, which is output by the microwave output unit, to an antenna of a chamber main body;
   a tuner provided in the wave guide tube and configured to adjust a position of a movable plate so that impedance on the microwave output unit side and impedance on the antenna side match each other;
   a demodulation unit provided in the wave guide tube and including a first processer, the first processer programmed to acquire reflected wave power that is power of a reflected wave from the antenna side for each frequency, between the antenna and the tuner; and a controller including a second processor and a memory storing a reference absorption frequency associated with a process condition, the second processor programmed to:

set a process condition;

cause the microwave output unit to generate a microwave on the basis of the setting process condition;

calculate a frequency, at which the reflected wave power becomes a minimum point, as an absorption frequency; and when a difference between the reference absorption frequency stored in the memory corresponding to the set process condition and the calculated absorption frequency is equal to or less than a predetermined threshold value, increase or decrease a power supply frequency of the microwave output unit that is used in process processing so that the difference becomes larger than the predetermined threshold value, wherein the second processor is further programmed not to change the power supply frequency when the difference exceeds the predetermined threshold value, and wherein the predetermined threshold value is 5 Mhz.

* * * * *